(12) United States Patent
Sato et al.

(10) Patent No.: US 11,482,647 B2
(45) Date of Patent: Oct. 25, 2022

(54) LIGHT EMITTING DEVICE HAVING RECOGNIZABLE AMBER COLOR EMISSION

(71) Applicant: NICHIA CORPORATION, Anan (JP)

(72) Inventors: Yuji Sato, Anan (JP); Miyuki Kurata, Anan (JP)

(73) Assignee: NICHIA CORPORATION, Anan (JP)

( * ) Notice: Subject to any disclaimer, the term of this patent is extended or adjusted under 35 U.S.C. 154(b) by 230 days.

(21) Appl. No.: 17/032,755

(22) Filed: Sep. 25, 2020

(65) Prior Publication Data
US 2021/0098656 A1    Apr. 1, 2021

(30) Foreign Application Priority Data

Sep. 30, 2019   (JP) .............................. JP2019-180199

(51) Int. Cl.
*H01L 33/50*   (2010.01)
*H01L 25/16*   (2006.01)
*C09K 11/77*   (2006.01)
*H01L 33/32*   (2010.01)

(52) U.S. Cl.
CPC ........ *H01L 33/502* (2013.01); *C09K 11/7734* (2013.01); *C09K 11/7774* (2013.01); *H01L 25/167* (2013.01); *H01L 33/32* (2013.01); *H01L 2933/0041* (2013.01)

(58) Field of Classification Search
CPC . H01L 33/502; H01L 25/167; C09K 11/7734; C09K 11/7774
See application file for complete search history.

(56) References Cited

U.S. PATENT DOCUMENTS

| | | | | |
|---|---|---|---|---|
| 8,551,362 | B2 * | 10/2013 | Oshio | ................. C04B 35/6268 |
| | | | | 313/503 |
| 8,647,906 | B2 * | 2/2014 | Ichikawa | ................ H01L 33/50 |
| | | | | 438/46 |
| 8,957,439 | B2 | 2/2015 | Bechtel et al. | |
| 9,028,718 | B2 * | 5/2015 | Kijima | ............... C09K 11/7774 |
| | | | | 252/301.4 F |
| 9,711,688 | B2 | 7/2017 | Roitman et al. | |
| 10,324,242 | B2 | 6/2019 | Sano et al. | |
| 10,333,030 | B2 | 6/2019 | Wakamatsu et al. | |
| 10,608,150 | B2 | 3/2020 | Yuasa et al. | |
| 2011/0122176 | A1 * | 5/2011 | Numao | ................ G09G 3/3607 |
| | | | | 345/88 |

(Continued)

FOREIGN PATENT DOCUMENTS

JP    H05-290606 A    11/1993
JP    2012-510716 A    5/2012

(Continued)

*Primary Examiner* — Tracie Y Green
(74) *Attorney, Agent, or Firm* — Foley & Lardner LLP

(57) ABSTRACT

A light emitting device includes: a light emitting element having a light emission peak wavelength in a range of 380 nm or more and 470 nm or less, and a wavelength conversion member disposed on a light emission side of the light emitting device and comprising: a fluorescent material layer containing a fluorescent material excited by light emitted from the light emitting device, having a light emission peak wavelength in a range of 500 nm or more and 780 nm or less, and a band-pass filter layer disposed on a light emission side of the fluorescent material layer.

19 Claims, 13 Drawing Sheets

(56) References Cited

U.S. PATENT DOCUMENTS

| | | | |
|---|---|---|---|
| 2011/0157916 A1* | 6/2011 | Lee | G02F 1/1336 |
| | | | 362/613 |
| 2011/0220953 A1 | 9/2011 | Bechtel et al. | |
| 2013/0087821 A1* | 4/2013 | Do | H01L 33/507 |
| | | | 257/98 |
| 2013/0242543 A1* | 9/2013 | Do | H01L 27/15 |
| | | | 362/97.1 |
| 2015/0034990 A1 | 2/2015 | Roitman et al. | |
| 2015/0162503 A1 | 6/2015 | Bechtel et al. | |
| 2016/0003440 A1 | 1/2016 | Wataya et al. | |
| 2017/0067620 A1 | 3/2017 | Sano et al. | |
| 2018/0040775 A1 | 2/2018 | Wakamatsu et al. | |
| 2018/0351053 A1 | 12/2018 | Yuasa et al. | |
| 2019/0234581 A1 | 8/2019 | Iwakura | |
| 2020/0194635 A1 | 6/2020 | Yuasa et al. | |

FOREIGN PATENT DOCUMENTS

| | | |
|---|---|---|
| JP | 2015-088220 A | 5/2015 |
| JP | 2017-054102 A | 3/2017 |
| JP | 2018-022844 A | 2/2018 |
| JP | 2018-206853 A | 12/2018 |
| JP | 2019-133794 A | 8/2019 |

* cited by examiner

LIGHT EMITTING DEVICE HAVING RECOGNIZABLE AMBER COLOR EMISSION

CROSS-REFERENCE TO RELATED PATENT APPLICATION

This application claims priority to Japanese Patent Application No. 2019-180199, filed on Sep. 30, 2019, the disclosure of which is hereby incorporated reference in its entirety.

BACKGROUND

The present disclosure relates to a light emitting device.

A light emitting device equipped with a light emitting diode (which may be hereinafter referred to as an "LED") and a wavelength converting member including a fluorescent material has been known. The light emitting device has been used, for example, as a light emitting device for a vehicle, such as a stop lamp or a brake lamp, a turn signal lamp or a blinker, a tail lamp, and a reversing lamp. In such devices, standards for the color, the brightness, and the like of the lamp light and the reflected light have been established.

For example, Japanese Patent Publication No. 2015-88220 describes a light emitting device for a vehicle that includes an LED emitting blue light and a fluorescent material that absorbs light radiated from the LED and emits light containing a red component. For a turn signal lamp of a vehicle, a light emitting device that includes an LED emitting blue light and a fluorescent material that absorbs light radiated from the LED and emits light that is amber in color has been used. There is an increasing demand for the enhancement of the light emission characteristics of such devices.

SUMMARY

An object of one embodiment of the present disclosure is to provide a light emitting device that emits light capable of being visually recognized as amber in color.

A first embodiment of the present disclosure relates to a light emitting device including: a light emitting element having a light emission peak wavelength in a range of 380 nm or more and 470 nm or less, and a wavelength conversion member disposed on a light emission side of the light emitting device, including a fluorescent material layer containing a fluorescent material excited by light emitted from the light emitting device, having a light emission peak wavelength in a range of 500 nm or more and 780 nm or less, and a band-pass filter layer disposed on a light emission side of the fluorescent material layer. The band-pass filter layer transmits light in a wavelength range of 560 nm or more and 630 nm or less, and for light having an incident angle in a range of 0° or more and 30° or less, has an average reflectance to the light in a wavelength range of 380 nm or more and less than 560 nm of 90% or more, and an average reflectance to the light in a wavelength range of more than 630 nm and 780 nm or less of 90% or more, and in a case in which a red filter is disposed on a side of a light emission surface of the light emitting device, has a wavelength difference ΔW of 25 nm or less between a wavelength Wt at a transmittance of 80% in a transmission spectrum of the red filter and a wavelength Ws at a reflectance of 80% on a short wavelength side in a reflection spectrum of the band-pass filter layer. The light emitting device emits light, in an xy chromaticity coordinate system of the CIE 1931 chromaticity diagram, is in a region A that is demarcated by a first straight line connecting a first point and a second point, a second straight line connecting a second point and a third point, a third straight line connecting a third point and a fourth point, and a fourth straight line connecting a fourth point and a first point, wherein, the chromaticity coordinate (x,y) is (x=0.545, y=0.425) for the first point, (x=0.557, y=0.442) for the second point, (x=0.609, y=0.390) for the third point, and (x=0.597, y=0.390) for the fourth point.

According to certain embodiments of the present disclosure, a light emitting device that emits light capable of being visually recognized as amber in color can be provided.

DETAILED DESCRIPTION

Figure 1A:
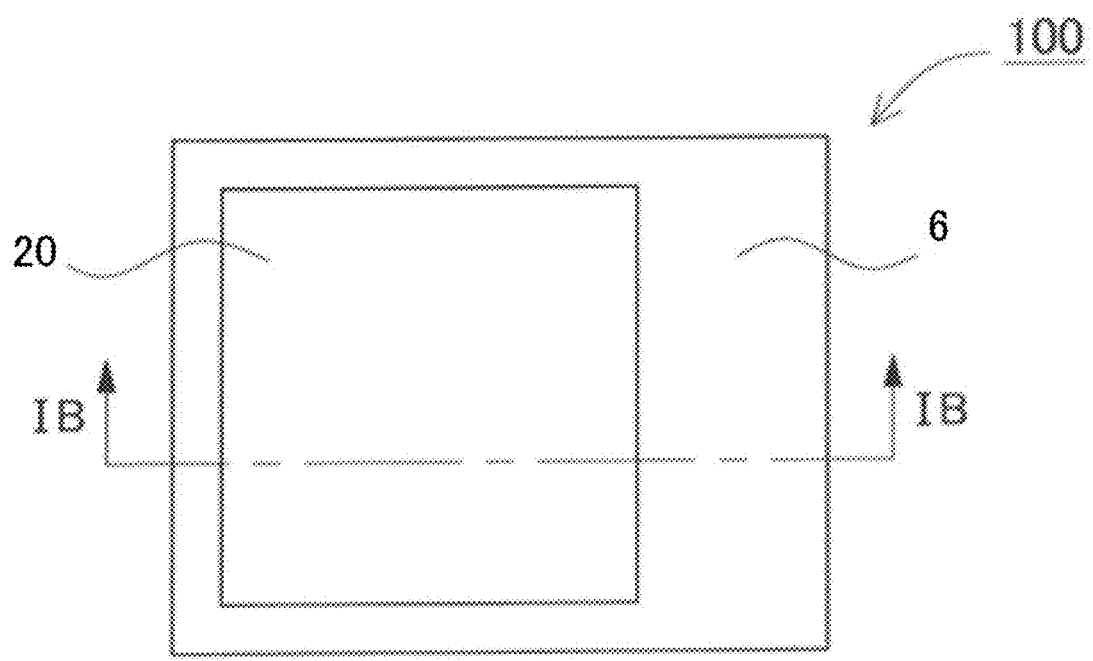
FIG. 1A is a schematic plane view of a light emitting device according to the first embodiment.

There may be a case in which a light emitting device having a fluorescent material emitting light that is amber in color is disposed next to a light emitting device emitting light in red color for a stop lamp, and a red color filter is disposed on the light emission side of the two light emitting devices as a cover for the red lamp region. A light emitting device combining an LED emitting blue light and a fluorescent material emitting light that is amber in color has a light emission spectrum with a large full width at half maximum of the light emission peak, and in the case in which the light emitting device is disposed next to a light emitting device emitting light in red color for a stop lamp, and a red color filter is disposed on the light emission side thereof, the light transmitted through the red filter may be visually recognized as red in color but not amber in color in some cases. The full width at half maximum of the light emission peak in the light emission spectrum means the wavelength width of the light emission peak at 50% of the maximum value of the light emission peak in the light emission spectrum. An object of one embodiment of the present disclosure is to provide a light emitting device that emits light capable of being visually recognized as amber in color even in the case in which the light is transmitted through a red filter.

The light emitting device according to the present disclosure will be described with reference to embodiments below. However, the embodiments shown below are examples for practicing the technical concept of the present disclosure, and the present disclosure is not limited to the light emitting devices shown below. The relationship between the color name and the chromaticity coordinate, the relationship between the wavelength range of light and the color name of monochromic light, and the like are in accordance with JIS Z8110.

Light Emitting Device

The light emitting device includes a light emitting element having a light emission peak wavelength in a range of 380 nm or more and 470 nm or less, and a wavelength conversion member disposed on a light emission side of the light emitting device, including a fluorescent material layer containing a fluorescent material excited by light emitted from the light emitting device, having a light emission peak wavelength in a range of 500 nm or more and 780 nm or less, and a band-pass filter layer disposed on a light emission side of the fluorescent material layer. The band-pass filter layer transmits light in a wavelength range of 560 nm or more and 630 nm or less, and for light having an incident angle in a range of 0° or more and 30° or less, has an average reflectance to the light in a wavelength range of 380 nm or more and less than 560 nm of 90% or more, and an average reflectance to the light in a wavelength range of more than 630 nm and 780 nm or less of 90% or more, and in a case in which a red filter is disposed on a side of a light emission surface of the light emitting device, has a wavelength difference ΔW of 25 nm or less between a wavelength Wt at a transmittance of 80% in a transmission spectrum (spectral transmission curve) of the red filter and a wavelength Ws at a reflectance of 80% on a short wavelength side in a reflection spectrum of the band-pass filter layer. The light emitting device emits light in a region A that is demarcated by a first straight line connecting a first point and a second point, a second straight line connecting a second point and a third point, a third straight line connecting a third point and a fourth point, and a fourth straight line connecting a fourth point and a first point, wherein in an xy chromaticity coordinate system of the CIE 1931 chromaticity diagram, the chromaticity coordinate (x,y) is (x=0.545, y=0.425) for the first point, (x=0.557, y=0.442) for the second point, (x=0.609, y=0.390) for the third point, and (x=0.597, y=0.390) for the fourth point.

The light emitting device emits light in the region A in an xy chromaticity coordinate system of the CIE (Commission Internationale de l'Eclairage) 1931 chromaticity diagram. The region A is the target color tone range of the light emission color of the light emitting device, and the light emission color of the light emitting device has a chromaticity coordinate (x,y) existing within the target color tone range, resulting in light that is amber in color (yellowish red color) emitted from the light emitting device. In the case in which a red filter is disposed on the side of the light emission surface of the light emitting device, the light emitting device preferably emits light that is amber in color having a chromaticity coordinate (x,y) within the region A, i.e., the target color tone range, even after transmitting through the red filter that has a transmission spectrum (spectral transmission curve) having a wavelength at a transmittance of 80% in a range of 615 nm or less. In the description herein, the term "red filter" means a red filter that has a transmission spectrum having a wavelength at a transmittance of 80% in a range of 615 nm or less.

The amber color of the light emitted from the light emitting device corresponds to the region including the long wavelength region of the yellow color and the short wavelength region of the yellowish red color in JIS Z8110, or the chromaticity range between the yellow region and the short wavelength region of the yellowish red color in JIS Z9101 defining safety color, and for example, has a light emission spectrum with a peak at a dominant wavelength in a range of 580 nm or more and 600 nm or less.

The light emitting device preferably has a light emission spectrum of light emitted from the light emitting device having a first integrated value ratio $Z_2/Z_1$ of an integrated value $Z_2$ of a light emission intensity in a wavelength range of 400 nm or more and less than 600 nm with respect to an integrated value $Z_1$ of a light emission intensity in a wavelength range of 600 nm or more and 800 nm or less of 0.8 or more. In the description herein, light that is emitted from the light emitting device but is not transmitted through a red filter is referred to as light emitted from the light emitting device unless otherwise particularly indicated. In the case in which the light emission spectrum of the light emitted from the light emitting device has an integral value ratio $Z_2/Z_1$ of the integrated value $Z_2$ of the light emission intensity on the short wavelength side with respect to the integrated value $Z_1$ of the light emission intensity on the long wavelength side is 0.8 or more, the light transmitted through the red filter also has a chromaticity coordinate (x,y) within the target region A of the color tone range with less color tone conversion. The first integrated value ratio $Z_2/Z_1$ of light emitted from the light emitting device is more preferably 0.9 or more, and further preferably 1.0 or more, and may be 8.0 or less, may be 7.5 or less, and may be 7.0 or less.

The light emitting device preferably has a light emission spectrum of light emitted from the light emitting device and, in the case in which a red filter is disposed, transmitted through the red filter having a second integrated value ratio $Z_{R2}/Z_{R1}$ of an integrated value $Z_{R2}$ of a light emission intensity in a wavelength range of 400 nm or more and less than 600 nm with respect to an integrated value $Z_{R1}$ of a light emission intensity in a wavelength range of 600 nm or more and 800 nm or less of 0.5 or more. In the case in which the light emission spectrum of the light emitted from the light emitting device and transmitted through the red filter has an integral value ratio $Z_{R2}/Z_{R1}$ of the integrated value $Z_{R2}$ of the light emission intensity on the short wavelength side with respect to the integrated value $Z_{R1}$ of the light emission intensity on the long wavelength side that is as high as 0.5 or more, the light having a chromaticity coordinate (x,y) within the target region A of the color tone range emitted from the light emitting device is visually recognized as being amber colored light even after transmitting through the red filter. The second integrated value ratio $Z_{R2}/Z_{R1}$ of light emitted from the light emitting device after transmitting through the red filter is more preferably 0.6 or more, further preferably 0.7 or more, still further preferably 0.8 or more, and particularly preferably 0.9 or more, and may be 8.0 or less, may be 7.5 or less, and may be 7.0 or less.

The light emitting device preferably emits light having a light emission spectrum having a first light emission peak wavelength in a range of 575 nm or more and 615 nm or less and a first full width at half maximum of 70 nm or less. In the description herein, the light emission peak wavelength means the wavelength at the peak top of the light emission peak in the light emission spectrum. In the case in which the light emitting device emits light having a light emission spectrum having a first light emission peak wavelength in a range of 575 nm or more and 615 nm or less and a narrow first full width at half maximum of 70 nm or less, the light emitting device emits light having a chromaticity coordinate (x,y) within the target region A of the color tone range and retaining the light emission in amber color even after transmitting through the red filter in the case in which the red filter is disposed. In the case in which the light emitting device emits light having a light emission spectrum having a first light emission peak wavelength in a range of 575 nm or more and 615 nm or less, which is a wavelength of amber color (yellowish red color), and a first full width at half maximum of 70 nm or less, the light emitting device emits light having the target wavelength of amber color, and retains the light emission in amber color with less change in color tone even after transmitting through the red filter. The light emitting device more preferably emits light having a light emission spectrum having a first light emission peak wavelength in a range of 575 nm or more and 615 nm or less and a first full width at half maximum of 60 nm or less, and further preferably a first full width at half maximum of 50 nm or less. With a smaller first full width at half maximum, light having the target wavelength of amber color can be transmitted through the red filter more readily, and in the case in which the red filter is disposed, has a chromaticity coordinate (x,y) within the target region A of the color tone range, retaining the light emission in amber color even after transmitting through the red filter. In the light emission spectrum of the light emitting device, the first full width at half maximum may be 3 nm or more, may be 5 nm or more, and may be 10 nm or more.

In the case in which a red filter is disposed, the light emitting device preferably emits light transmitted through the red filter having a light emission spectrum having a second light emission peak wavelength in a range of 575 nm or more and 615 nm or less and a second full width at half maximum of 60 nm or less. In the case in which the light emitting device emits light transmitted through the red filter having a light emission spectrum having a second light emission peak wavelength in a range of 575 nm or more and 615 nm or less and a narrow second full width at half maximum of 60 nm or less, the light emitting device emits light having a chromaticity coordinate (x,y) within the target region A of the color tone range and having the light emission color visually recognized as amber in color with less color tone conversion even after transmitting through the red filter. In the case in which the red filter is disposed, and the light emitting device emits light transmitted through the red filter having a light emission spectrum having a second light emission peak wavelength in a range of 575 nm or more and 615 nm or less, which is a wavelength of amber color (yellowish red color), and a second full width at half maximum of 60 nm or less, the light emission color is not changed to red color even after transmitting through the red filter, retaining the light emission in amber color. In the case in which the red filter is disposed, the light emitting device more preferably emits light transmitted through the red filter having a light emission spectrum having a second light emission peak wavelength in a range of 575 nm or more and 615 nm or less and a second full width at half maximum of 50 nm or less, and more preferably a second full width at half maximum of 40 nm or less. With a smaller second full width at half maximum, in the case in which the red filter is disposed, the light has a chromaticity coordinate (x,y) within the target region A of the color tone range, retaining the light emission in amber color even after transmitting through the red filter. In the light emission spectrum of the light emitting device, the second full width at half maximum may be 3 nm or more, may be 5 nm or more, and may be 10 nm or more.

The light emitting device preferably has a light emission spectrum having a relative light emission intensity at a wavelength of 450 nm of 0.1 or less, or 0.08 or less, or 0.001 or less, assuming that the maximum light emission intensity of the light emission peak wavelength in the light emission spectrum of the light emitting device is 1. The band-pass filter layer used in the light emitting device has an angle dependency, in which the reflectance of light that is incident in the normal direction perpendicular to the band-pass filter layer, i.e., incident at an incident angle of 0°, is different from the reflectance of light that is incident at an incident angle exceeding 30°, and the light emitted from the light emitting element that is incident at an incident angle exceeding 30° may escape from the band-pass filter to cause color unevenness of light emitted from the light emitting device in some cases. In the case in which light emitting device has a light emission spectrum having a relative light emission intensity at a wavelength of 450 nm of 0.1 or less assuming that the maximum light emission intensity of the light emission peak wavelength in the light emission spectrum of the light emitting device is 1, the blue light having a light emission peak wavelength in a range of 380 nm or more and 470 nm or less emitted from the light emitting element can be suppressed from escaping from the light emitting device to cause color unevenness. With a smaller relative light intensity at a wavelength of 450 nm in the light emission spectrum of the light emitting device, the light emission color of light emitted from the light emitting device has a high color purity.

Figure 1B:
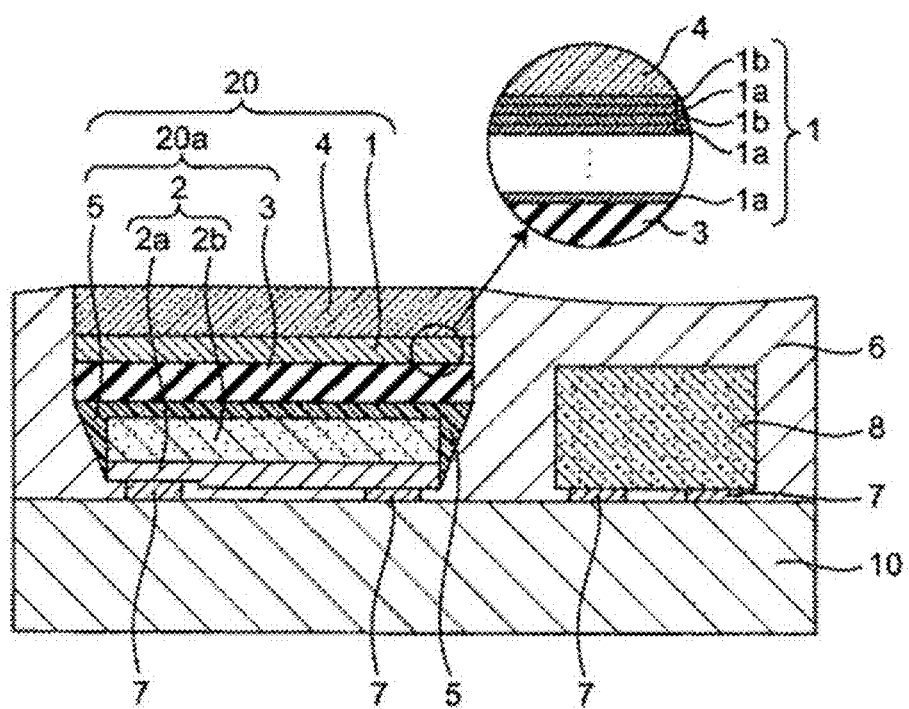
FIG. 1B is a schematic cross sectional view of a light emitting device according to the first embodiment.

One example of the light emitting device according to one embodiment of the present disclosure will be described with reference to the drawings. FIG. 1A is a schematic plane view of a light emitting device 100 of one embodiment of the present disclosure, and FIG. 1B is a schematic cross sectional view of the light emitting device 100.

The light emitting device 100 includes a light emission laminated part 20 having a light emission surface of the light emitting device 100, and a covering member 6.

The light emission laminated part 20 is provided on a substrate 10, and includes a light emitting part 20a including a light emitting element 2 and a fluorescent material layer 3, and a band-pass filter layer 1. A translucent member 4 may be provided on the light emission side of the band-pass filter layer 1. The translucent member 4 is preferably disposed in contact with the light emission side of the band-pass filter layer 1 for emitting light with high efficiency from the band-pass filter layer 1 to the outside through the translucent member 4.

The light emission laminated part 20 is covered with the covering member 6 on the substrate 10 except for the surface of the translucent member 4, which is the light emission surface. The side surfaces of the light emitting part 20a including the light emitting element 2 and the fluorescent material layer 3 are covered with the covering member 6 that substantially entirely reflects, for example, visible light, and the surface thereof opposite to the light emitting element 2 is covered with the band-pass filter layer 1 that transmits the light in the particular wavelength range emitted from the fluorescent material contained in the fluorescent material layer 3 and mainly reflects the light emitted from the light emitting element 2. According to the structure, the light emitting device 100 emits light having in a wavelength range of 560 nm or more and 630 nm or less transmitted through the band-pass filter layer 1 at an incident angle in a range of 0° or more and 30° or less. The covering member 6 reflects both the light emitted from the light emitting element 2 and the light emitted from the fluorescent material contained in the fluorescent material layer 3.

The light emitting element 2 is provided on the substrate 10 via a conductive member 7, and emits light having a light emission peak wavelength in a range of 380 nm or more and 470 nm or less by applying a voltage via wiring provided on the substrate 10.

The fluorescent material layer 3 is provided on the light emission surface of the light emitting element 2, and excited by the light emitted from the light emitting element 2, and emits light having a light emission peak wavelength in a range of 500 nm or more and 780 nm or less through wavelength conversion by the fluorescent material contained in the fluorescent material layer 3. In the description herein, the expression "an article is provided on a member B", for example, "a layer is provided on a light emission surface of a light emitting element 2", encompasses the case in which an article is provided in contact with a member B, and the case in which an article is provided on a member B via another layer. The fluorescent material layer 3 is provided on the light emission surface of the light emitting element 2 via an adhesive layer 5.

The band-pass filter layer 1 is provided on the fluorescent material layer 3, and has a function of reflecting the light emitted from the light emitting element 2 and transmitting the light in the particular wavelength range emitted from the fluorescent material layer 3. The band-pass filter layer 1 specifically has a function of reflecting the light having a light emission peak wavelength in a range of 380 nm or more and 470 nm or less emitted from the light emitting element 2 and transmitting the light having a light emission peak wavelength in a range of 560 nm or more and 630 nm or less in the light emitted from the fluorescent material contained in the fluorescent material layer 3. The band-pass filter layer 1 may be configured to reflect the light in a wavelength range of 380 nm or more and less than 560 nm and the light in a wavelength range of more than 630 nm and 780 nm or less for the light at an incident angle in a range of 0° or more and 30° or less, and to transmit the light in the particular wavelength range emitted from the fluorescent material contained in the fluorescent material layer 3.

The light emitting device 100 may include a semiconductor element 8, such as a protection element for protecting the light emitting element 2 against breakage due to the application of an excessive voltage. In the case in which the semiconductor element 8 is included, the covering member 6 may be provided, for example, to cover the semiconductor element 8. The semiconductor element 8 referred herein does not encompass a light emitting element.

In the light emitting device 100 having the aforementioned structure, the light emitting part 20a including the light emitting element 2 and the fluorescent material layer 3 is covered with the covering member 6 reflecting both the light emitted from the light emitting element 2 and the light emitted from the fluorescent material layer 3, and with the band-pass filter layer 1 reflecting the light emitted from the light emitting element 2 and transmitting the light emitted from the fluorescent material layer 3. According to the structure, the light emitting device 100 emits light having a light emission spectrum that is substantially equivalent to the light emission spectrum of the light emitted from the fluorescent material layer 3.

The light emitting device emits light that is amber in color having a light emission peak wavelength in a range of 575 nm or more and 615 nm or less and a chromaticity coordinate (x,y) within the target region A of the color tone range in such a manner that the fluorescent material contained in the fluorescent material layer 3 having a light emission peak wavelength in a range of 500 nm or more and 780 nm or less is excited by the light having a light emission peak wavelength in a range of 380 nm or more and 470 nm or less emitted from the light emitting element 2, and for the light at an incident angle in a range of 0° or more and 30° or less, the band-pass filter layer 1 reflects 90% or more of the light in a wavelength range of 380 nm or more and 560 nm or less and the light in a wavelength range of more than 630 nm and 780 nm or less.

The members constituting the light emitting device 100 will be described below.

Substrate 10

The substrate 10 preferably has an insulating property, and it is preferably difficult for light to be transmitted through therethrough. Examples of the material for the substrate 10 include ceramics, such as alumina and aluminum nitride, and a resin, such as a phenol resin, an epoxy resin, a polyimide resin, a bismaleimide triazine resin (BT resin), and a polyphthalamide. Among these, ceramics are preferred due to the high thermal radiation capability thereof. In the case in which a resin is used, an inorganic filler, such as glass fibers, silicon oxide, titanium oxide, and alumina, may be mixed with the resin depending on necessity, thereby achieving the enhancement of the mechanical strength, the reduction of the thermal expansion ratio, and the enhancement of the light reflectance.

Light Emitting Element 2

The light emitting element 2 is for exciting the fluorescent material contained in the fluorescent material layer 3. Preferred examples of the light emitting element 2 used include a light emitting diode (LED) chip and a laser diode (LD) chip, and an LED chip is preferably used. The use of a light emitting diode chip as the light emitting element 2 facilitates the broadening of the light emitted from the light emitting element 2, and thereby the fluorescent material contained in the fluorescent material layer 3 can be excited by high efficiency. The light emitting element 2 has a light emission peak wavelength in a range of 380 nm or more and 470 nm or less, preferably has a light emission peak wavelength in a range of 390 nm or more and 465 nm or less, and more preferably has a light emission peak wavelength in a range of 400 nm or more and 460 nm or less, and emits light having a large amount of a blue component.

The light emitting element 2 used may be, for example, a semiconductor light emitting element using a nitride semiconductor represented by the formula $In_XAl_YGa_{1-X-Y}N$ (wherein 0≤X, 0≤Y, and X+Y≤1).

The light emitting element 2 has a semiconductor laminate 2a provided with a p-electrode and an n-electrode. The light emitting element 2 may have the p-electrode and the n-electrode provided on the same side of the light emitting element 2, and the light emitting element 2 may be mounted on the substrate 10 by a flip chip method.

Fluorescent Material Layer 3

The fluorescent material layer 3 absorbs the light emitted from the light emitting element 2 and converts light having a wavelength that is different from the absorbed light. The fluorescent material layer 3 may be formed, for example, by printing a composition for forming a fluorescent material layer containing fluorescent material particles and a translucent binder on the surface of the translucent member 4 via the band-pass filter layer 1.

The thickness of the fluorescent material layer 3 is preferably in a range of 20 μm or more and 200 μm or less, more preferably in a range of 30 μm or more and 180 μm or less, and further preferably in a range of 50 μm or more and 130 μm or less. In the case in which the thickness of the fluorescent material layer 3 is in a range of 20 μm or more and 200 μm or less, the light emitting device that emits light that is amber in color having the target light emission intensity and a chromaticity coordinate (x,y) within the target region A of the color tone range in the CIE 1931 chromaticity diagram can be obtained.

In the case in which the fluorescent material layer 3 is formed with the composition for forming a fluorescent material layer, the amount of the fluorescent material particles contained in the composition for forming a fluorescent material layer is preferably in a range of 20 parts by mass or more and 280 parts by mass or less, and more preferably in a range of 50 parts by mass or more and 250 parts by mass or less, per 100 parts by mass of the binder. In the case in which the amount of the fluorescent material particles contained in the composition for forming the fluorescent material layer 3 is in a range of 20 parts by mass or more and 280 parts by mass or less per 100 parts by mass of the binder, the fluorescent material layer 3 that that emits light that is amber in color having the target light emission intensity and a chromaticity coordinate (x,y) within the target region A of the color tone range in the CIE 1931 chromaticity diagram through excitation with the light emitted from the light emitting element 2 can be formed. Specifically, the light emission spectrum of the light emitted from the light emitting element 2 and the light emission spectrum of the light emitted from the fluorescent material through excitation with the light emitted from the light emitting element 2 are measured in advance, and the fluorescent material layer 3 is formed by controlling the amount of the fluorescent material contained in the fluorescent material layer 3 or the thickness of the fluorescent material layer, based on the light emission spectrum of the fluorescent material measured by the measurement method described in the examples described later, the reflectance of the band-pass filter layer 1 obtained through simulation, and the transmission spectrum of the red filter measured by the measurement method described in the examples described later, so as to make the chromaticity coordinate of the light emission color of the light emitted from the light emitting device 100 through the band-pass filter layer 1 within the target region A of the color tone range in the CIE 1931 chromaticity diagram.

Fluorescent Material

The fluorescent material contained in the fluorescent material layer 3 of the light emitting device 100 is excited by the light emitted from the light emitting element 2. The fluorescent material contained in the fluorescent material layer 3 has a light emission spectrum of the fluorescent material having a light emission peak wavelength in a range of 500 nm or more and 780 nm or less. The fluorescent material preferably has a light emission spectrum having a light emission peak wavelength in a range of 520 nm or more and 670 nm or less and a full width at half maximum in a range of 2 nm or more and 120 nm or less. In the case in which the fluorescent material contained in the fluorescent material layer 3 has a light emission peak wavelength in a range of 520 nm or more and 670 nm or less and a full width at half maximum in a range of 2 nm or more and 120 nm or less, the light emitting device 100 combining the fluorescent material layer 3 containing the fluorescent material, the light emitting element, and the band-pass filter layer 1 can emit light having a light emission peak wavelength in a range of 575 nm or more and 615 nm or less and a narrow first full width at half maximum of 70 nm or less. Accordingly, the light emitting device 100 can emit light that is amber in color having a chromaticity coordinate (x,y) within the target region A of the color tone range. The light emitted from the light emitting device 100 can retain the light emission in amber color with less color tone conversion even after transmitting through the red filter. In the light emission spectrum of the fluorescent material, the light emission peak wavelength may be in a range of 530 nm or more and 660 nm or less, may be in a range of 540 nm or more and 650 nm or less, may be in a range of 550 nm or more and 640 nm or less, and may be in a range of 560 nm or more and 630 nm or less. In the light emission spectrum of the fluorescent material, the full width at half maximum of the light emission peak having a light emission peak wavelength in a range of 500 nm or more and 780 nm or less may be in a range of 5 nm or more and 110 nm or less, and may be in a range of 10 nm or more and 100 nm or less.

The average particle diameter of the fluorescent material is preferably in a range of 2 μm or more and 40 μm or less, more preferably in a range of 3 μm or more and 30 μm or less, and further preferably in a range of 5 μm or more and 25 μm or less. In the case in which the particle diameter of the fluorescent material particles is large, the extraction efficiency of light may be increased due to the decrease of the scattering thereof, but the amount of light that is not subjected to the wavelength conversion is increased since the amount of light that is emitted by the fluorescent material is decreased due to the small surface area of the particles. The light that is not subjected to the wavelength conversion is returned to the side of the fluorescent material layer 3 by the band-pass filter layer 1, and therefore the large particle diameter of the fluorescent material particles can achieve the wavelength conversion of the light emitted from the light emitting element 2 with high efficiency while suppressing the scattering on the surface of the particles. Therefore, with a larger particle diameter of the fluorescent material particles, the light emitted from the light emitting element 2 can be efficiently subjected to the wavelength conversion, and the light extraction efficiency can be enhanced. In the case in which the fluorescent material particles are too large, on the other hand, the handleability thereof may be deteriorated. The average particle diameter of the fluorescent material particles may be measured by a Fisher sub-sieve sizer method (which may be hereinafter referred to as an "FSSS method"). The FSSS method is a one kind of the air permeability method, and is a method of measuring the specific surface area utilizing the flow resistance of air, so as to obtain mainly the particle diameter of primary particles.

The average particle diameter measured by the FSSS method is the Fisher sub-sieve sizer's number.

The fluorescent material contained in the fluorescent material layer 3 preferably contains at least one kind of a fluorescent material selected from the group consisting of a rare earth aluminate fluorescent material having a composition containing Ce, an α-SiAlON fluorescent material, a first nitride fluorescent material having a composition containing at least one kind of a first metal element $M^1$ selected from the group consisting of Ba, Sr, Ca, and Mg, at least one kind of a second metal element $M^2$ selected from the group consisting of Eu, Ce, Tb, and Mn, Si, and N, having a molar ratio of Si of 8, a molar ratio of N of 5, a molar ratio of the first metal element $M^1$ and the second metal element $M^2$ of 2, and a molar ratio of the second metal element $M^2$ of a product of a parameter y and 2, wherein the parameter y is a value in a range of 0.001 or more and 0.5 or less, per 1 mol of the composition, a second nitride fluorescent material having a composition containing Ca, Si, Al, Eu, N, and depending on necessity Sr, having a molar ratio of Eu of 0.01 or more and 0.04 or less, a molar ratio of Si of 0.8 or more and 1.2 or less, and a molar ratio of N of 2.5 or more and 3.2 or less, per 1 mol of the composition, and a fluoride fluorescent material having a composition containing at least one kind of an element A or an ion A selected from the group consisting of an alkali metal element and an ammonium ion, and at least one kind of an element $M^3$ selected from the group consisting of a Group 4 element and a Group 14 element, activated by $Mn^{4+}$.

The fluorescent material contained in the fluorescent material layer 3 preferably contains at least one kind of a fluorescent material selected from the group consisting of a rare earth aluminate fluorescent material having a composition represented by the following formula (I), an α-SiAlON fluorescent material having a composition represented by the following formula (II), a first nitride fluorescent material having a composition represented by the following formula (III), a second nitride fluorescent material having a composition represented by the following formula (IV), and a fluoride fluorescent material having a composition represented by the following formula (V).

The rare earth aluminate fluorescent material preferably has a composition represented by the following formula (I):

$(Ln_{1-a}Ce_a)_3Al_5O_{12}$      (I)

wherein in the formula (I), Ln represents at least one element selected from the group consisting of Y, Gd, Lu, and Tb, and a satisfies 0<a≤0.022.

The α-SiAlON fluorescent material preferably has a composition represented by the following formula (II):

$Ca_b(Si,Al)_{12}(O,N)_{16}:Eu$      (II)

wherein in the formula (II), b satisfies 0<b≤2.

In the description herein, the plural elements delimited by a comma (,) means that at least one kind of the plural elements is contained in the composition. For the plural elements delimited by a comma (,) in the compositional formula, the composition contains at least one element selected from the plural elements delimited by a comma, and may contain two or more kinds selected from the plural elements in combination. In the description herein, in the formulae showing the compositions of the fluorescent materials, the term before the colon (:) shows the elements constituting the base crystal and the molar ratios in the composition thereof, and the term after the colon (:) shows the activation element.

The first nitride fluorescent material preferably has a composition represented by the following formula (III):

$(M^1_{1-c}M^2_c)_2Si_5N_8$      (III)

wherein in the formula (III), $M^1$ represents at least one element selected from the group consisting of Ba, Sr, Ca, and Mg, $M^2$ represents at least one element selected from the group consisting of Eu, Ce, Tb, and Mn, and c satisfies 0.001≤c<0.5.

The second nitride fluorescent material preferably has a composition represented by the following formula (IV):

$Ca_sSr_tEu_uSi_vAl_wN_x$      (IV)

wherein in the formula (IV), s, t, u, v, w, and x satisfy 0.25≤s≤0.5, 0.4≤t≤0.75, 0.01≤u≤0.04, 0.8≤s+t+u≤1.1, 0.8≤v≤1.2, 0.8≤w≤1.2, 1.8≤v+w≤2.2, and 2.5≤x≤3.2.

The fluoride fluorescent material preferably has a composition represented by the following formula (V):

$A_2[M^3_{1-g}Mn^{4+}_gF_6]$      (V)

wherein in the formula (V), A represents at least one kind of an element or an ion selected from the group consisting of K, Li, Na, Rb, Cs, and $NH_4^+$, $M^3$ represents at least one kind of an element selected from the group consisting of a Group 4 element and a Group 14 element, and g satisfies 0<g<0.2.

The fluorescent material layer 3 may contain a fluorescent material other than the rare earth aluminate fluorescent material containing Ce, the α-SiAlON fluorescent material, the first nitride fluorescent material, the second nitride fluorescent material, and the fluoride fluorescent material. Examples of the fluorescent material contained in the fluorescent material layer 3 include $Si_{6-z}Al_zOzN_{8-z}:Eu$ (0<z<4.2), $Ca_3Sc_2Si_3O_{12}:Ce$, $CaSc_2O_4:Ce$, $(La,Y,Gd)_3(Al,Si)_6N_{11}:Ce$, $(C_a,Sr,Ba)_8MgSi_4O_{16}(F,Cl,Br)_2:Eu$, $(Ca,Sr,Ba)_3Si_6O_9N_4:Eu$, $(Ca,Sr,Ba)_3Si_6O_{12}N_2:Eu$, $(Ba,Sr,Ca)Si_2O_2N_2:Eu$, $(Ba,Sr,Ca,Mg)_2SiO_4:Eu$, $(Ca,Sr,Ba)S:Eu$, $(Ba,Sr,Ca)Ga_2S_4:Eu$, $(Ca,Sr,Ba,Mg)_{10}(PO_4)_6(F,Cl,Br,I,OH)_2:Eu$, $(Ba,Sr,Ca)_3MgSi_2O_8:Eu$, $3.5MgO.0.5MgF_2.GeO_2:Mn$, $Sr_4Al_{14}O_{25}:Eu$, $(Si,Al)_6(O,N)_8:Eu$, and $(Sr,Ca)LiAl_3N_4:Eu$.

Band-Pass Filter Layer 1

The band-pass filter layer 1 transmits light in a wavelength range of 560 nm or more and 630 nm or less, and for light having an incident angle in a range of 0° or more and 30° or less, has an average reflectance to the light in a wavelength range of 380 nm or more and less than 560 nm of 90% or more, and an average reflectance to the light in a wavelength range of more than 630 nm and 780 nm or less of 90% or more. The band-pass filter layer 1 specifically has a function of reflecting the light having a light emission peak wavelength in a range of 380 nm or more and 470 nm or less emitted from the light emitting element 2 and red light in a range of 630 nm or more and 780 nm or less, and transmitting the light having a light emission peak wavelength in a range of 560 nm or more and 630 nm or less in the light emitted from the fluorescent material contained in the fluorescent material layer 3.

In the case in which the red filter is disposed, the band-pass filter layer 1 has a wavelength difference ΔW of 25 nm or less between the wavelength Wt at a transmittance of 80% in the transmission spectrum (spectral transmission curve) of the red filter and the wavelength Ws at a reflectance of 80% on the short wavelength side in the reflection spectrum of the band-pass filter layer. Even though the red filter is disposed on the light emission side of the light emitting device 100, in the case in which the wavelength difference ΔW between the wavelength Wt at a transmittance of 80% in the transmission spectrum of the red filter and the wavelength Ws at a reflectance of 80% on the short wavelength side in the reflection spectrum of the band-pass filter layer is 25 nm or less, the wavelength region that is cut by the red filter in the light that is amber in color transmitted through the band-pass filter layer 1 is small, and the color tone after transmitting through the red filter can be suppressed from being changed, so as to retain the light emission in amber color emitted from the light emitting device 100. In the case in which the red filter is disposed, the band-pass filter layer 1 preferably has a wavelength difference ΔW of 24 nm or less, more preferably 23 nm or less, further preferably 22 nm or less, still further preferably 21 nm or less, and particularly preferably 20 nm or less, between the wavelength Wt at a transmittance of 80% in the transmission spectrum (spectral transmission curve) of the red filter and the wavelength Ws at a reflectance of 80% on the short wavelength side in the reflection spectrum of the band-pass filter layer. The wavelength difference ΔW is preferably smaller, but there are cases where the wavelength difference ΔW cannot be 0 nm in consideration of the function of the red filter transmitting red light and the function of the band-pass filter layer transmitting light that is amber in color, and the wavelength difference ΔW may be 1 nm or more, or may be 2 nm or more.

The band-pass filter layer 1 preferably includes a dielectric multilayer film. The dielectric multilayer film may be constituted by a multilayer film including a first dielectric material layer 1a and a second dielectric material layer 1b having refractive indices different from each other, which are alternately laminated. The band-pass filter layer 1 may be configured to reflect the light in a wavelength range of 380 nm or more and less than 560 nm and the light in a wavelength range of more than 630 nm and 780 nm or less for the light at an incident angle in a range of 0° or more and 30° or less, and to transmit the light having a light emission peak wavelength in a range of 560 nm or more and 630 nm or less emitted from the fluorescent material contained in the fluorescent material layer 3, by setting the thicknesses of the first dielectric material layers 1a and the second dielectric material layers 1b, based on the light emission spectrum (i.e., the center wavelength and the intensity distribution with respect to the wavelength) of the light emitted from the light emitting element 2, the first refractive index of the first dielectric material layer 1a, and the second refractive index of the second dielectric material layer 1b. The band-pass filter layer 1 may be constituted by forming the dielectric multilayer film by measuring the transmission spectrum of a commercially available red filter in advance, and making a wavelength difference ΔW of 25 nm or less between the wavelength Wt at a transmittance of 80% in the transmission spectrum of the red filter and the wavelength Ws at a reflectance of 80% on the short wavelength side in the reflection spectrum of the band-pass filter layer. The band-pass filter layer 1 formed of the dielectric multilayer film may be formed by periodically laminating two kinds of layers having refractive indices different from each other, i.e., the first dielectric material layer 1a and the second dielectric material layer 1b, alternately with a thickness of λ/4. λ is the peak wavelength of the wavelength range to be reflected, and is the in-medium wavelength in the dielectric material. It has been theoretically known that the dielectric multilayer film has a higher reflectance with a larger difference in refractive index between the first dielectric material layer 1a and the second dielectric material layer 1b, and with a larger number of periods of the layers formed alternately. On the other hand, in the case in which the difference in refractive index between the two layers, i.e., the first dielectric material layer 1a and the second dielectric material layer 1b, is too large, or in the case in which the number of periods of the formation thereof is too large, the reflectance may be sharply decreased on both sides of the refraction peak wavelength λ (i.e., the wavelength dependency may be sharp), and the wavelength dependency of the reflectance may be increased, making it difficult to provide the target reflectance stably in the target wavelength range. Accordingly, in the band-pass filter layer 1, the refractive indices and the difference in refractive index of the first dielectric material layer 1a formed of a dielectric material having a low refractive index and the second dielectric material layer 1b formed of a dielectric material having a high refractive index, and the number of periods thereof formed alternately are appropriately set to provide the target reflectance stably within the target wavelength range. In the case in which the red filter is disposed, in the band-pass filter layer 1, the refractive indices and the difference in refractive index of the first dielectric material layer 1a and the second dielectric material layer 1b, and the number of periods thereof formed alternately are appropriately set to provide the wavelength difference between the wavelength at the particular transmittance in the transmission spectrum of the red filter and the wavelength at the particular transmittance in the reflection spectrum of the band-pass filter layer formed of the dielectric multilayer film in the particular range.

Specifically, the refractive index (first refractive index) of the first dielectric material layer 1a having a low refractive index may be set, for example, to a range of 1.0 or more and 1.8 or less, and preferably to a range of 1.2 or more and 1.6 or less. Examples of the first dielectric material layer 1a include $SiO_2$ (having a refractive index, for example, of 1.5). The refractive index (second refractive index) of the second dielectric material layer 1b having a high refractive index may be set, for example, to a range of 1.5 or more and 3.0 or less, and preferably to a range of 2.0 or more and 2.6 or less. Examples of the second dielectric material layer 1b include $Nb_2O_5$ (having a refractive index, for example, of 2.4). The number of periods of the first dielectric material layer 1a and the second dielectric material layer 1b formed alternately may be set, for example, to a range of 1 or more and 30 or less, and preferably to a range of 1 or more and 25 or less.

The dielectric material constituting the first dielectric material layer 1a may be selected, for example, from $SiO_2$, $Al_2O_3$, and SiON. The dielectric material constituting the second dielectric material layer 1b may be constituted by a material selected, for example, from $TiO_2$, $Nb_2O_3$, $Ta_2O_5$, and $Zr_2O_5$.

The band-pass filter layer 1 formed of the dielectric multilayer film preferably has a high selectivity with a high reflectance in the reflection wavelength range and a high transmittance in the transmission wavelength range. The high selectivity of the band-pass filter layer 1 formed of the dielectric multilayer film means that the change of the reflectance or the transmittance is sharp between the reflection wavelength range and the transmission wavelength range.

Translucent Member 4

The band-pass filter layer 1 and the fluorescent material layer 3 are provided on one surface of the translucent member 4, which supports the band-pass filter layer 1 and the fluorescent material layer 3. The translucent member 4 used may be a plate member formed of a translucent material, such as glass or a resin. The glass may be selected, for example, from borosilicate glass and quartz glass. The resin may be selected, for example, from a silicone resin and an epoxy resin. The thickness of the translucent member 4 may be a thickness that does not lower the mechanical strength in the production process and can impart a sufficient mechanical strength to the fluorescent material layer 3.

Adhesive Layer 5

The adhesive layer 5 adheres the light emitting element 2 and the fluorescent material layer 3. The adhesive layer 5 is preferably formed of a material that can guide the light emitted from the light emitting element 2 to the fluorescent material layer 3 while preventing the light from being attenuated as much as possible. Specific examples thereof include an organic resin, such as an epoxy resin, a silicone resin, a phenol resin, and a polyimide resin.

Semiconductor Element 8

The semiconductor element 8 is a protective element for preventing the light emitting element 2 against breakage or performance deterioration of the element due to the application of an excessive voltage. Specifically, the semiconductor element 8 may be constituted by a Zener diode, which becomes a conducting state on application of a voltage higher than the prescribed voltage.

The height of the semiconductor element 8 in mounting is preferably lower than the laminated height of the light emitting element 2, the fluorescent material layer 3, the band-pass filter layer 1, and the translucent member 4. The uppermost surface of the covering member 6 can be elevated by utilizing the outer shape of the semiconductor element 8, so as to suppress the shrinkage of the resin (i.e., the dent formed on the surface of the resin in curing).

Covering Member 6

The material used for the covering member 6 is preferably an insulating material. For example, a thermosetting resin, a thermoplastic resin may be used for securing the strength. Specific examples thereof include a phenol resin, an epoxy resin, a bismaleimide-triazine resin (BT resin), a polyphthalamide (PPA) resin, and a silicone resin. A filler that is hard to absorb the light emitted from the light emitting element 2 and has a large difference in refractive index from the base resin may be dispersed in the base resin, so as to enable the efficient reflection of light. For example, the amount of the reflection member contained in the covering member 6 may be 30% by mass or more based on the total amount of the covering member 6 as 100% by mass. The median diameter at a cumulative frequency of 50% in the volume based particle size distribution measured by the laser diffraction scattering method of the reflection member is, for example, 20 µm or more, and may be 100 µm or more, in consideration of the reflectance. In the case in which the reflection member has a shape that has a long axis and a short axis, such as an ellipsoidal shape, an acicular shape, a bar shape, a flaky shape, the long axis is, for example, 20 µm or more, and may be 100 µm or more, in consideration of the reflectance.

The covering member 6 may be formed, for example, in such manner that on the upper side of the fixed substrate 10, the covering member 6 is charged between the light emission laminated part 20 including the light emitting element 2, the fluorescent material layer 3, the band-pass filter layer 1 (i.e., the dielectric multilayer film), and the translucent member 4, and the semiconductor element 8, with a resin discharging device that is capable of moving (movable) in the vertical direction or the horizontal direction with respect to the substrate 10.

Filler

The covering member 6 may contain a filler that is hard to absorb the light emitted from the light emitting element 2 and has a large difference in refractive index from the base resin dispersed in the base resin, and thereby can efficiently reflect the light. The filler is preferably an oxide containing at least one kind of an element selected from the group consisting of yttrium, zirconium, aluminum, titanium, magnesium, and silicon. Examples of the filler include $SiO_2$, $Y_2O_3$, $TiO_2$, $Al_2O_3$, $ZrO_2$, and MgO. The amount of the filler contained in the covering member 6 is preferably in a range of 10 parts by mass or more and 100 parts by mass or less per 100 parts by mass of the resin in consideration of the reflectivity and the workability.

Conductive Member 7

The conductive member 7 used may be a bump, and the material used for the bump may be Au or an alloy thereof, and other conductive members, such as eutectic solder (Au—Sn), Pb—Sn, and lead-free solder. FIG. 1B shows an example where a bump is used as the conductive member 7, but the conductive member 7 is not limited to a bump, and may be, for example, a conductive paste.

Underfill

An underfill is a member for protecting the light emitting element 2, the semiconductor element 8, and the conductive member 7 disposed on the substrate from dusts, moisture, and external force. The underfill may be provided depending on necessity between the light emitting element 2 and the semiconductor element 8, and the conductive member 7. Examples of the material for the underfill include a silicone resin, an epoxy resin, and a urea resin. The underfill may contain a colorant, a light diffusing agent, and a filler, depending on necessity.

Method for Producing Light Emitting Device

A method for producing the light emitting device will be described below.

The method for producing the light emitting device may include the following first to fourth steps in the order of the first step to the fourth step.

A: First step of mounting a light emitting element on a substrate

B: Second step of forming a band-pass filter layer and a fluorescent material layer on a translucent member C: Third step of disposing the translucent member having the band-pass filter layer and the fluorescent material layer on the light emitting element and bonding thereto, so as to make a light emission laminated part D: Fourth step of covering a side surface of the light emission laminated part except for the light emission surface thereof with a composition for a covering member, so as to form a covering member First Step In the first step, a light emitting element is disposed on a substrate, and mounted thereon. In the case in which an aggregate substrate is used, plural light emitting elements are disposed on the aggregate substrate. A semiconductor element may be disposed between one light emitting element and another light emitting element adjacent thereto in one of the row direction and the column direction of the light emitting elements disposed. The light emitting element and the semiconductor element may be mounted on the substrate, for example, by the flip chip method.

Second Step

In the second step, a band-pass filter layer and a fluorescent material layer are formed on a translucent member.

A translucent member in a plate form is prepared. Subsequently, for example, a first dielectric material layer and a second dielectric material layer having refractive indices different from each other are laminated alternately on the translucent member, so as to form a band-pass filter layer formed of a dielectric multilayer film.

The dielectric multilayer film can be formed by forming the first dielectric material layer and the second dielectric material layer alternately by atomic layer deposition (ALD), sputtering, vapor deposition, or the like. Among these, the formation of the films by the atomic layer deposition (ALD) is preferred since the first dielectric material layer and the second dielectric material layer each can be formed with a uniform thickness.

The band-pass filter layer preferably has a reflection spectrum of the band-pass filter layer at an incident angle of 0° having a wavelength $W50_S$ having a reflection intensity of 50% on the short wavelength side and a wavelength $W50_L$ having a reflection intensity of 50% on the long wavelength side within the following ranges, assuming that the maximum reflection intensity in a range of 380 nm or more and 780 nm or less is 100%. The band-pass filter layer preferably has a reflection spectrum at an incident angle of 0° having a wavelength $W50_S$ having a reflection intensity of 50% on the short wavelength side in a range of 560 nm or more and 590 nm or less, and more preferably in a range of 565 nm or more and 585 nm or less, assuming that the maximum reflection intensity in a range of 380 nm or more and 780 nm or less is 100%. The band-pass filter layer preferably has a reflection spectrum at an incident angle of 0° having a wavelength $W50_L$ having a reflection intensity of 50% on the long wavelength side in a range of more than 590 nm and 625 nm or less, and more preferably in a range of 595 nm or more and 620 nm or less, assuming that the maximum reflection intensity in a range of 380 nm or more and 780 nm or less is 100%. In the case in which the band-pass filter layer has a reflection spectrum at an incident angle of 0° having a wavelength $W50_S$ having a reflection intensity of 50% on the short wavelength side and a wavelength $W50_L$ having a reflection intensity of 50% on the long wavelength side within the aforementioned ranges, assuming that the maximum reflection intensity in a range of 380 nm or more and 780 nm or less is 100%, the light emitting device can emit light that is amber in color having a chromaticity coordinate (x,y) within the target color tone range.

The fluorescent material layer is then formed on the band-pass filter layer. The fluorescent material layer may be formed on the band-pass filter layer, for example, by a printing method. In the printing method, the fluorescent material layer may be formed in such a manner that a composition for forming a fluorescent material layer containing a fluorescent material, a binder, and depending on necessity a solvent is prepared, and the composition for forming a fluorescent material layer is coated on the surface of the band-pass filter layer formed of the dielectric multilayer film, and then dried. Examples of the binder used include an organic binder, such as an epoxy resin, a silicone resin, a phenol resin, and a polyimide resin, and an inorganic binder, such as glass. The fluorescent material layer contains the fluorescent material that is excited by the light emitted from the light emitting element having a wavelength in a range of 380 nm or more and 470 nm or less, and has a light emission peak wavelength in a range of 500 nm or more and 780 nm or less. Specifically, the light emission spectrum of the light emitted from the light emitting element and the light emission spectrum of the light emitted from the fluorescent material through excitation with the light emitted from the light emitting element are measured in advance, and the fluorescent material layer is formed by controlling the amount of the fluorescent material contained in the fluorescent material layer or the thickness of the fluorescent material layer, based on the light emission spectrum of the fluorescent material, the reflectance of the band-pass filter layer obtained through simulation, and the transmission spectrum of the red filter, so as to make the chromaticity coordinate (x,y) of the light emission color of the light emitted from the light emitting device through the band-pass filter layer transmitting light in a wavelength range of 560 nm or more and 630 nm or less and having an average reflectance to light in a wavelength range of 380 nm or more and less than 560 nm of 90% or more and an average reflectance to light in a wavelength range of more than 630 nm and 780 nm or less of 90% or more for the light at an incident angle in a range of 0° or more and 30° or less, within the target region A of the color tone range in the CIE 1931 chromaticity diagram.

The fluorescent material layer may be formed by a compression molding method, a fluorescent material electrodeposition method, a fluorescent material sheet method, instead of the printing method. In the compression molding method, a material for forming a fluorescent material layer containing a binder and a fluorescent material is molded with a mold on the reflection film. In the fluorescent material electrodeposition method, a conductive thin film having transparency is formed on the surface of the reflection film in advance, and an electrically charged fluorescent material is accumulated on the thin film through electrophoresis. In the fluorescent material sheet method, a fluorescent material is kneaded with a silicone resin and processed into a sheet form to provide a fluorescent material sheet, which is fixed to the surface of the reflection film, and for example, a fluorescent material film having a thickness of 100 μm or less is united to the reflection film by bonding to the surface thereof under pressure.

The translucent member having the band-pass filter layer and the fluorescent material layer formed thereon is divided into pieces each having a size that is capable of being disposed on the light emission surface of the light emitting element. According to the procedures above, the translucent member having the band-pass filter layer and the fluorescent material layer united thereto is obtained. In the following description, the translucent member having the band-pass filter layer and the fluorescent material layer is referred to as a translucent laminated member. The translucent laminated member divided into pieces preferably has the shape of the surface of the fluorescent material layer that has a plane area slightly larger than the light emission surface of the light emitting element, in consideration of the mounting accuracy.

Third Step

In the third step, the fluorescent material layer is faced to the light emission surface of the light emitting element, and the translucent laminated member is bonded to the light emitting element with the adhesive layer. According to the procedure, the light emission laminated part including the light emitting element and the translucent laminated member is produced. In a preferred embodiment, the bonding surface of the translucent laminated member to the light emitting element, i.e., the bonding surface of the fluorescent material layer to the light emitting element, is larger than the light emission surface of the light emitting element, and therefore the adhesive running off from the light emission surface of the light emitting element is attached to the side surface of the light emitting element, resulting in a runoff part of the adhesive having an approximately triangular vertical cross section. The runoff part of the adhesive attached to the side surface of the light emitting element has a triangular shape having a thickness of the layer that is decreased toward the lower part of the light emitting element.

Fourth Step

In the fourth step, the side surface of the light emission laminated part except for the light emission surface is covered with a composition for forming a covering member, so as to form a covering member on the side surface of the light emission laminated part except for the light emission surface. In the case in which plural light emitting elements and semiconductor elements are disposed on the aggregate substrate, and the translucent laminated members are bonded to the light emitting elements to form the light emission laminated parts, the composition for forming a covering member is filled between the light emission laminated parts. The covering member is to reflect the light emitted from the light emitting element, and is formed to cover the side surface of the light emission laminated part without covering the upper surface thereof and to bury the semiconductor element. The runoff part attached to the side surface of the light emitting element has a triangular cross sectional shape having a thickness that is decreased toward the lower part of the light emitting element, and therefore the covering member covering the side surface of the light emitting element has an inclination spreading upward. According to the structure, the light emitted from the side surface of the light emitting element is reflected toward the fluorescent material layer and thus can excite the fluorescent material, resulting in the enhancement of the luminance.

In the case in which plural light emission laminated parts are formed on the aggregate substrate, the covering member and the aggregate substrate are cut into individual light emitting devices each including one light emitting element and one semiconductor element.

According to the procedures described above, the light emitting device of the embodiment shown in FIGS. 1A and 1B can be produced. In the case in which a light emitting device having no substrate is produced, the substrate may be removed after forming covering member, or after forming the covering member and before or after cutting the substrate.

In the description of the embodiment above, the example of the light emitting device having the band-pass filter layer provided between the translucent member and the fluorescent material layer, but the band-pass filter layer may be provided on the translucent member. In other words, the translucent member may be disposed between the fluorescent material layer and the band-pass filter layer. Even in the case in which the light emitting device is constituted in this manner, the light emitted from the light emitting element can be prevented from being emitted outside the light emitting device, by covering the entire side surface of the light emission laminated part with the reflection resin.

EXAMPLES

The present disclosure will be described more specifically with reference to examples below. However, the present invention is not limited to the examples.

Fluorescent Material

In the light emitting devices of Examples and Comparative Examples, a fluorescent material 1 and a fluorescent material 2 shown in Table 1 were used. A rare earth aluminate fluorescent material having a composition containing Ce was used as the fluorescent material 1. The second nitride fluorescent material was used as the fluorescent material 2. The evaluation methods for the fluorescent materials are shown below, and the evaluation results are shown in Table 1.

Evaluation of Fluorescent Material

Compositional Analysis

The fluorescent material 1 and the fluorescent material 2 were analyzed for the composition with an ICP-AES apparatus (manufactured by PerkinElmer, Inc.), an ion chromatography system (manufactured by Dionex Japan, Ltd.), and an oxygen-nitrogen analyzer (manufactured by Horiba, Ltd.). For the fluorescent material 1, the molar ratios of the constitutional elements in the composition were calculated based on the molar ratio of Al contained in 1 mol of the composition as 3. For the fluorescent material 2, the molar ratios of the constitutional elements in the composition were calculated based on the molar ratio of Al contained in 1 mol of the composition as 1.

Average Particle Diameter

The fluorescent materials were measured for the average particle diameter by the FSSS method with Fisher Sub-Sieve Sizer Model 95 (manufactured by Fisher Scientific International, Inc.). Specifically, a specimen in a volume of 1 cm$^3$ was collected and packed in a dedicated tube container, then dry air was flowed through the container at a constant pressure, and the specific surface area was read from the differential pressure, which was converted to the average particle diameter (Fisher sub-sieve sizer's number).

Light Emission Characteristics

Figure 2:
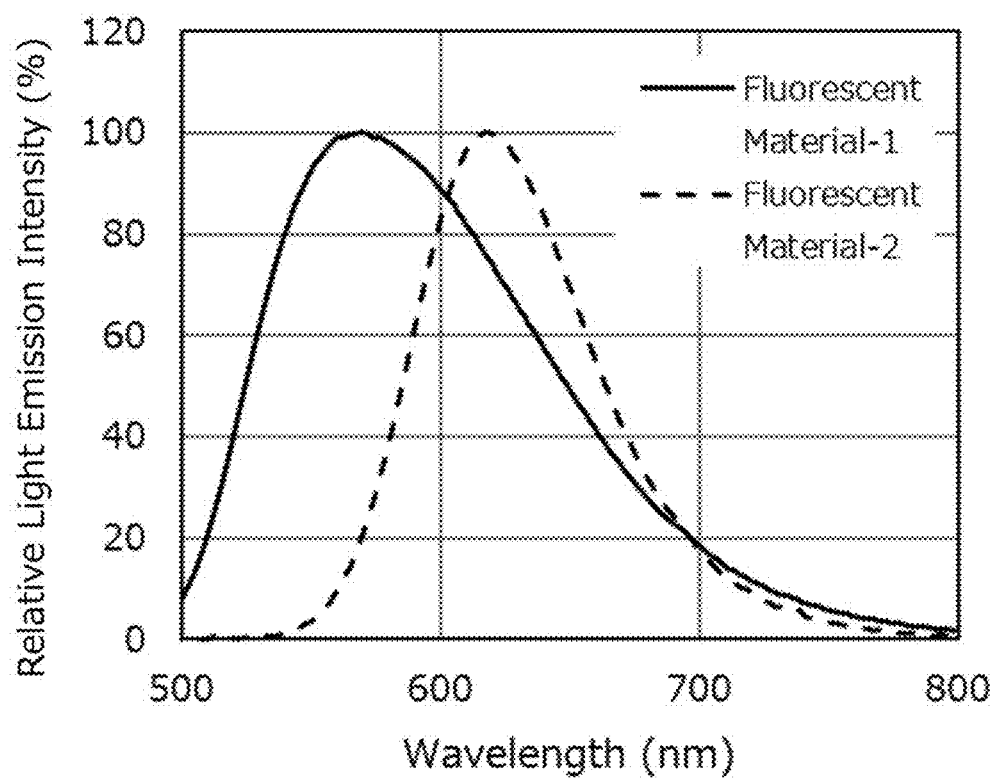
FIG. 2 is a chart showing the relative light emission spectra of the fluorescent material 1 and the fluorescent material 2.

The fluorescent materials were measured for the light emission characteristics. For the light emission characteristics of the fluorescent material, the light emission spectrum at room temperature (25° C.±5° C.) was measured by irradiating the fluorescent material with excitation light having a wavelength of 450 nm with a quantum efficiency measuring apparatus (Model Name: QE-2000, manufactured by Otsuka Electronics Co., Ltd.). FIG. 2 shows the light emission spectra of the fluorescent material 1 and the fluorescent material 2. The light emission peak wavelength (nm) and the full width at half maximum were obtained from the resulting light emission spectrum of the fluorescent material.

TABLE 1

|  | Composition | Average particle diameter (μm) | Peak wavelength (nm) | Full width at half maximum (nm) |
|---|---|---|---|---|
| Fluorescent material 1 | $(Y_{0.90}Gd_{0.07}Ce_{0.04})_3Al_5O_{12}$ | 6 | 569 | 125 |
| Fluorescent material 2 | $Ca_{0.12}Sr_{0.79}Eu_{0.01}AlSiN_{2.81}$ | 7 | 618 | 79 |

Band-Pass Filter Layer

The light emitting devices of Examples and Comparative Examples each had a band-pass filter layer formed of a dielectric multilayer film 1 (DBR-1) or a dielectric multilayer film 2 (DBR-2).

Reflection Spectrum

Figure 3:
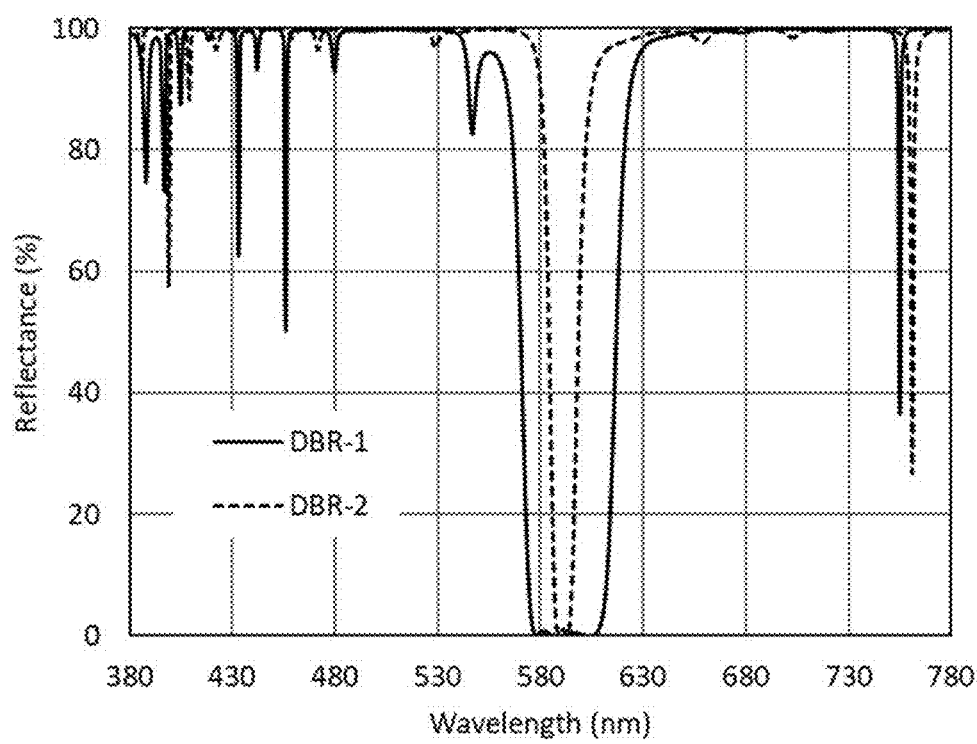
FIG. 3 is a chart showing the reflection spectra at an incident angle of 0° of the dielectric multilayer film 1 (DBR-1) and the dielectric multilayer film 2 (DBR-2) used in the light emitting devices of Examples and Comparative Examples.
Figure 4:
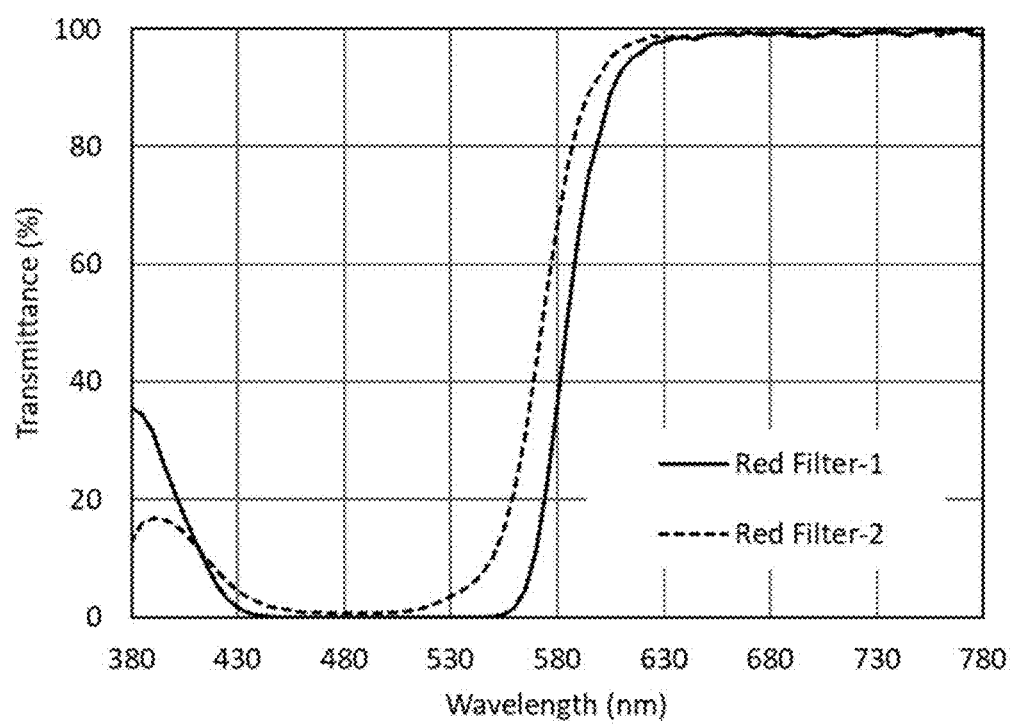
FIG. 4 is a chart showing the transmission spectra of the red filter 1 and the red filter 2 disposed in the light emitting devices of Examples and Comparative Examples.

The dielectric multilayer films each were irradiated with light emitted from an excitation light source in the normal direction of the dielectric multilayer film (i.e., an incident angle of 0°) and measured for the reflection spectrum in a range of 380 nm or more and 780 nm or less at room temperature (25° C.±5° C.) with a spectral photometer (Model name: V-670, manufactured by JASCO Corporation). FIG. 3 shows the reflection spectra of the dielectric multilayer film 1 (DBR-1) and the dielectric multilayer film 2 (DBR-2). In the reflection spectrum of the dielectric multilayer film at an incident angle of 0°, the wavelength $W50_S$ (nm) having a reflection intensity of 50% on the short wavelength side and the wavelength $W50_L$ (nm) having a reflection intensity of 50% on the long wavelength side assuming that the maximum reflection intensity in a range of 380 nm or more and 780 nm or less was 100% were measured. For light at an incident angle of 0°, the average reflectance (%) to light in a wavelength range of 380 nm or more and less than 560 nm and the average reflectance (%) to light in a wavelength range of more than 630 nm and 780 nm or less were measured. The results are shown in Table 2.

TABLE 2

| | 50% light emission intensity (nm) | | Average reflectance (%) | |
|---|---|---|---|---|
| | Short wavelength side $W50_S$ | Long wavelength side $W50_L$ | 380 nm or more and less than 560 nm | More than 630 nm and 780 nm or less |
| DBR-1 | 570 | 617 | 98 | 99 |
| DBR-2 | 584 | 599 | 99 | 99 |

The dielectric multilayer film 1 (DBR-1) had a reflectance to light in a wavelength range of 575 nm or more and 612 nm or less of 10% or less, and transmitted light in a wavelength range of 575 nm or more and 612 nm or less. The dielectric multilayer film 1 (DBR-1) had an average reflectance in a wavelength range of 380 nm or more and less than 560 nm of 90% or more and an average reflectance in a wavelength range of more than 630 nm and 780 nm or less of 90% or more.

The dielectric multilayer film 2 (DBR-2) had a reflectance to light in a wavelength range of 587 nm or more and 595 nm or less of 10% or less, and transmitted light in a wavelength range of 587 nm or more and 595 nm or less. The dielectric multilayer film 2 (DBR-2) had an average reflectance in a wavelength range of 380 nm or more and less than 560 nm of 90% or more and an average reflectance in a wavelength range of more than 630 nm and 780 nm or less of 90% or more.

Red Filter

In each of the light emitting devices of Examples and Comparative Examples, in consideration of the case in which a red filter was disposed, a red filter 1 or a red filter 2 was disposed on the side of the light emission surface of the light emitting device, so as to transmit the light emitted from the light emitting device 100 through the red filter.

Transmission Spectrum (Spectral Transmission Curve)

The red filters each were irradiated with light from an excitation light source in the normal direction of the red filter (i.e., an incident angle of 0°), and measured for the transmission spectrum (spectral transmission curve) in a wavelength range of 380 nm or more and 780 nm or less at room temperature (25° C.±5° C.) with a spectral photometer (Model name: U-2910, manufactured by Hitachi High-Tech Corporation). FIGS. 4 and 6 to 11 show the transmission spectra of the red filter 1 and the red filter 2. The red filters each were measured for the wavelength (nm) at a transmittance of 80% in the transmission spectrum (spectral transmission curve) to light at an incident angle of 0°. The results are shown in Table 3.

TABLE 3

| | Wavelength at transmittance of 80% (nm) |
|---|---|
| Red filter 1 | 598 |
| Red filter 2 | 587 |

Example 1

A light emitting device 100 shown in FIGS. 1A and 1B was produced.

First Step

An aluminum nitride substrate was used as the substrate 10. A nitride semiconductor emitting light having a light emission peak wavelength of 450 nm was used as the light emitting element 2. The light emitting element 2 was placed on the substrate 10 and mounted thereon by the flip chip method.

Second Step

A glass plate having a thickness of 150 μm was used as the translucent member 4.

A band-pass filter layer 1 formed of the dielectric multilayer film 1 (DBR-1) shown in Table 2 was produced on the translucent member 4. Specifically, the band-pass filter layer was produced in such a manner that the first dielectric material layer 1a formed of $SiO_2$ and the second dielectric material layer 1b formed of $Nb_2O_5$ were laminated on the translucent member 4 in the order of the second dielectric material layer 1b and the first dielectric material layer 1a alternately in 24 periods (48 layers in total) by the sputtering method. The band-pass filter layer 1 formed of the dielectric multilayer film 1 (DBR-1) was produced to transmit mainly light in a wavelength range of 575 nm or more and 612 nm or less, and to have an average reflectance to light in a wavelength range of 380 nm or more and less than 560 nm of 90% or more and an average reflectance to light in a wavelength range of more than 630 nm and 780 nm or less of 90% or more for light of an incident angle of 0°. The wavelength difference ΔW between the wavelength Wt at a transmittance of 80% in the transmission spectrum of the red filter and the wavelength Ws at a reflectance of 80% in the reflection spectrum of the band-pass filter layer 1 formed of the dielectric multilayer film 1 (DBR-1) was obtained.

The fluorescent material layer 3 was produced by coating a composition for forming a fluorescent material layer containing a silicone resin, the fluorescent material 1, and the fluorescent material 2 on the band-pass filter layer 1 by the printing method. The composition for forming a fluorescent material layer contains 233 parts by mass in total of the fluorescent material 1 and the fluorescent material 2 mixed with 100 parts by mass of the silicone resin. The fluorescent material 1 and the fluorescent material 2 were mixed to make a mass ratio of 2:1. Specifically, the light emission spectrum of the light emitted from the light emitting element 2 and the light emission spectrum of the light emitted from the fluorescent material 1 and the fluorescent material 2 through excitation with the light emitted from the light emitting element 2 were measured in advance, and the fluorescent material layer 3 was formed by controlling the amount of the fluorescent material contained in the fluorescent material layer 3 and the thickness of the fluorescent material layer, based on the light emission spectrum of the fluorescent materials used, the reflectance of the band-pass filter layer 1 obtained through simulation, and the transmission spectrum of the red filter in consideration of the case in which the red filter was used, so as to make the chromaticity coordinate (x,y) of the light emission color of the light emitted from the light emitting device 100 through the band-pass filter layer 1 within the target region A of the color tone range in the CIE 1931 chromaticity diagram. The thickness of the fluorescent material layer 3 was 74 μm.

A translucent laminated member including the band-pass filter layer 1 (dielectric multilayer film) and the fluorescent material layer 3 laminated on the translucent member 4 was thus provided. The translucent laminated member was divided into pieces to enable mounting on the light emitting element 2.

Third Step

The fluorescent material layer 3 of the translucent laminated member divided into pieces was faced to the light emission surface of the light emitting element 2, and the translucent laminated member was bonded to the light emitting element 2 with an adhesive layer containing a silicone resin, so as to produce a light emission laminated part 20.

Fourth Step

The circumference of the light emission laminated part 20 except for the light emission surface of the light emission laminated part 20 was covered with a composition for forming a covering member, and the composition for forming a covering member was cured to form the covering member 6, thereby producing the light emitting device 100. The composition for forming a covering member contained a silicone resin and a titanium oxide ($TiO_2$) filler. The amount of the filler mixed in the composition for forming a covering member was 60 parts by mass of the filler mixed with 100 parts by mass of the silicone resin.

Red Filter

The red filter 2 shown in Table 3 was disposed on the side of the light emission surface of the light emitting device 100 produced.

Example 2

In the second step, a band-pass filter layer 1 formed of the dielectric multilayer film 2 (DBR-2) shown in Table 2 was produced on the translucent member 4. Specifically, the band-pass filter layer was produced in such a manner that the first dielectric material layer 1a formed of $SiO_2$ and the second dielectric material layer 1b formed of $Nb_2O_5$ were laminated on the translucent member 4 in the order of the second dielectric material layer 1b and the first dielectric material layer 1a alternately in 23.5 periods (47 layers in total) by the sputtering method. A light emitting device 100 was produced in the same manner as in Example 1 except that the band-pass filter layer 1 formed of the dielectric multilayer film 2 (DBR-2) was produced to transmit mainly light in a wavelength range of 587 nm or more and 595 nm or less, and to have an average reflectance to light in a wavelength range of 380 nm or more and less than 560 nm of 90% or more and an average reflectance to light in a wavelength range of more than 630 nm and 780 nm or less of 90% or more for light of an incident angle of 0°. The red filter 1 shown in Table 3 was disposed on the side of the light emission surface of the light emitting device 100 produced.

Example 3

A light emitting device 100 was produced in the same manner as in Example 2, and the red filter 2 shown in Table 3 was disposed on the side of the light emission surface of the light emitting device 100 produced.

Comparative Example 1

A light emitting device 100 was produced in the same manner as in Example 1 except that the band-pass filter layer formed of a dielectric multilayer film was not produced, and the red filter 1 shown in Table 3 was disposed on the side of the light emission surface of the light emitting device 100 produced.

Comparative Example 2

A light emitting device 100 was produced in the same manner as in Example 1 except that the band-pass filter layer formed of a dielectric multilayer film was not produced, and the red filter 2 shown in Table 3 was disposed on the side of the light emission surface of the light emitting device 100 produced.

Comparative Example 3

A light emitting device 100 was produced in the same manner as in Example 1, and the red filter 1 shown in Table 3 was disposed on the side of the light emission surface of the light emitting device 100 produced.

The combinations of the fluorescent material used in the fluorescent material 3, the dielectric multilayer film (DBR) used in the band-pass filter layer 1, and the red filter in Examples and Comparative Examples are shown in Table 4.

TABLE 4

| | Fluorescent material used in fluorescent material layer | Band-pass filter layer DBR | Red filter |
|---|---|---|---|
| Example 1 | fluorescent material 1 + fluorescent material 2 | DBR-1 | red filter 2 |
| Example 2 | fluorescent material 1 + fluorescent material 2 | DBR-2 | red filter 1 |
| Example 3 | fluorescent material 1 + fluorescent material 2 | DBR-2 | red filter 2 |
| Comparative Example 1 | fluorescent material 1 + fluorescent material 2 | — | red filter 1 |
| Comparative Example 2 | fluorescent material 1 + fluorescent material 2 | — | red filter 2 |
| Comparative Example 3 | fluorescent material 1 + fluorescent material 2 | DBR-1 | red filter 1 |

Evaluation

The light emitted from the light emitting devices of Examples and Comparative Examples and the light emitted from the light emitting devices and transmitted through the red filters were evaluated as follows. In the following evaluation, the light emitting device was measured under application of an electric current of 350 mA. The results are shown in Table 5.

Chromaticity Coordinate (x,y)

Figure 5A:
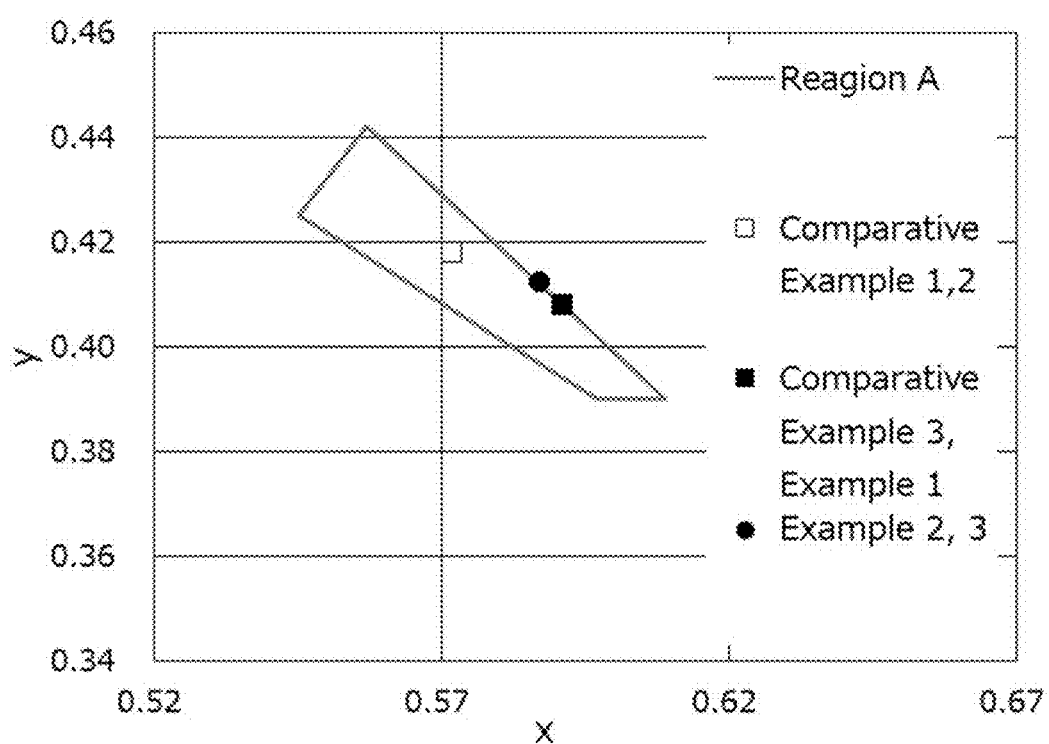
FIG. 5A is a chart showing the chromaticity coordinate (x,y) of the light emission color of the light emitting devices of Examples and Comparative Examples and the target color tone range (region A) in the CIE 1931 chromaticity diagram.
Figure 5B:
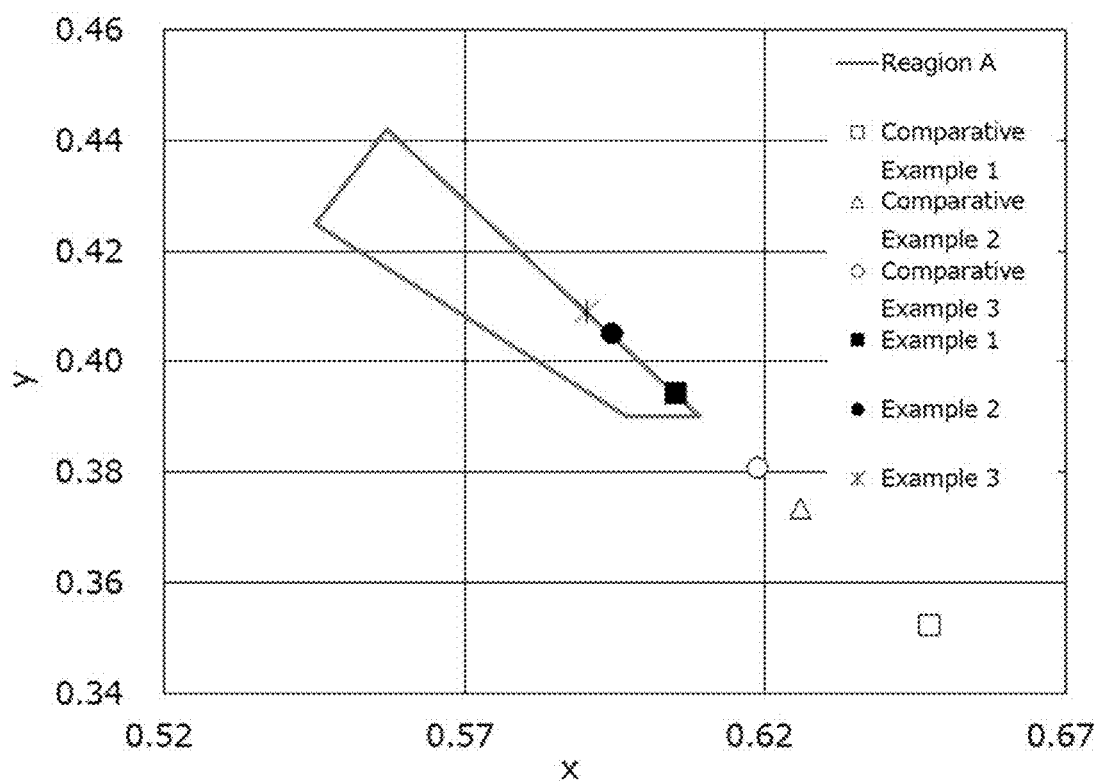
FIG. 5B is a chart showing the chromaticity coordinate (x,y) of the light emission color of the light emitting devices of Examples and Comparative Examples and the target color tone range (region A) in the CIE 1931 chromaticity diagram.

The light emitted from the light emitting devices of Examples and Comparative Examples and the light emitted from the light emitting devices and transmitted through the red filters each were measured for the chromaticity coordinate (x,y) in the chromaticity coordinate system of the CIE 1931 chromaticity diagram with an optical measurement system combining a multichannel spectroscope and an integral sphere. The target region A of the color tone range is a region that is demarcated by a first straight line connecting a first point and a second point, a second straight line connecting a second point and a third point, a third straight line connecting a third point and a fourth point, and a fourth straight line connecting a fourth point and a first point, wherein in an xy chromaticity coordinate system of the CIE 1931 chromaticity diagram, the chromaticity coordinate (x,y) is (x=0.545, y=0.425) for the first point, (x=0.557, y=0.442) for the second point, (x=0.609, y=0.390) for the third point, and (x=0.597, y=0.390) for the fourth point. In Table 5, the case in which the chromaticity coordinate (x,y) exists in the region A is shown as "in", and the case in which the chromaticity coordinate (x,y) does not exist in the region A is shown as "out". FIG. 5A is a chart showing the chromaticity coordinate (x,y) of the light emission color of the light emitting devices of Examples and Comparative Examples and the target color tone range (region A) in the CIE 1931 chromaticity diagram. FIG. 5B is a chart showing the chromaticity coordinate (x,y) of the light emission color of the light emitting devices of Examples and Comparative Examples after transmitting through the red filter and the target color tone range (region A) in the CIE 1931 chromaticity diagram.

Figure 6:
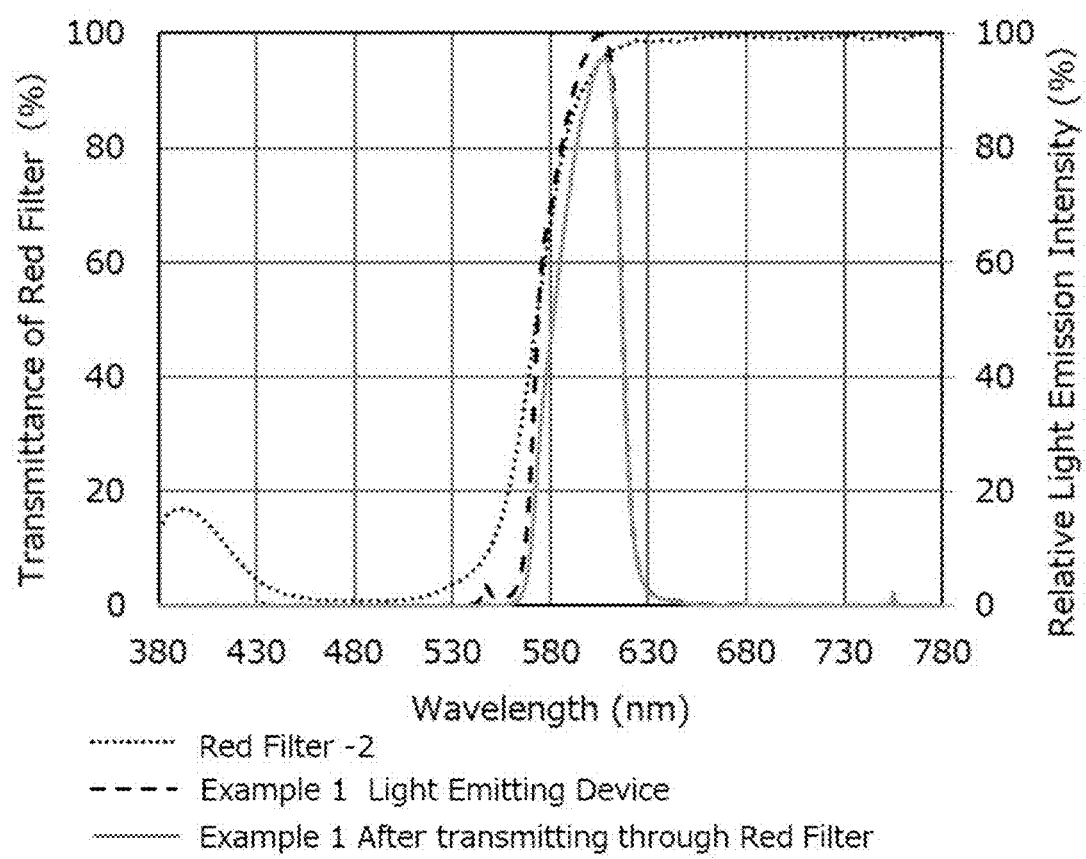
FIG. 6 is a chart showing the light emission spectra of the light emitted from the light emitting device of Example 1 and the light after transmitting through the red filter thereof, and the transmission spectrum of the red filter.
Figure 7:
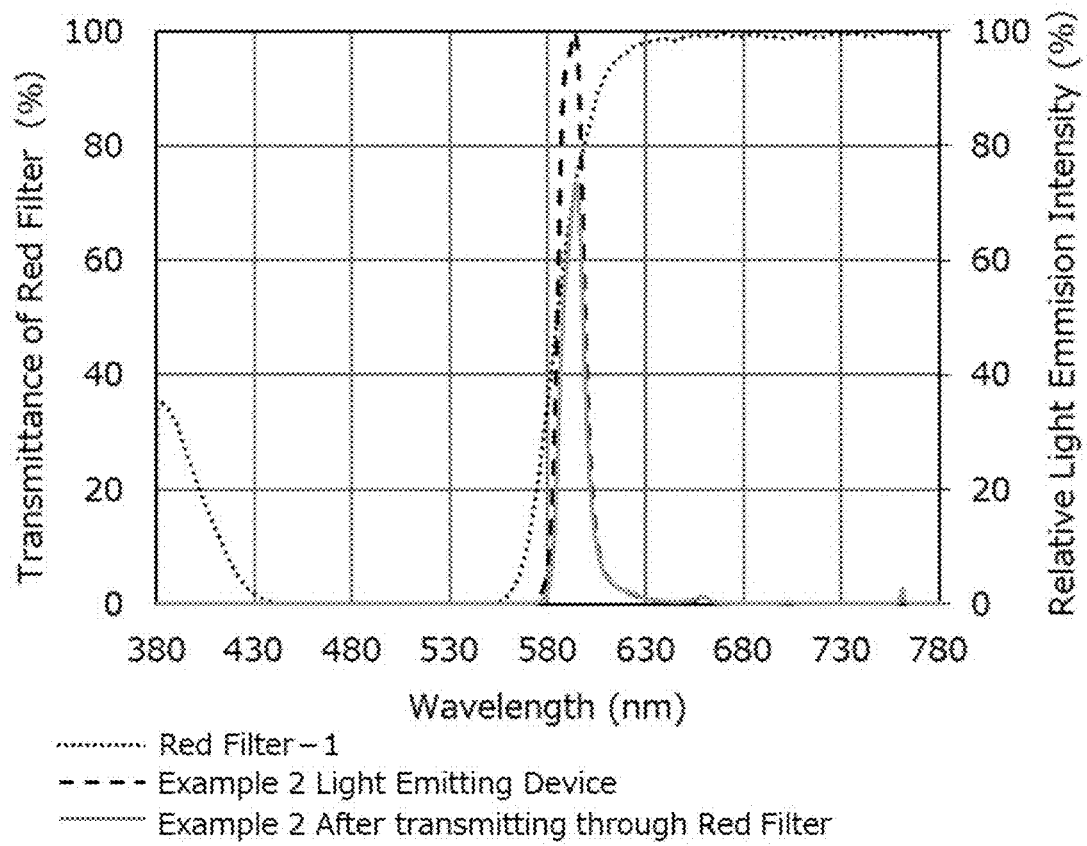
FIG. 7 is a chart showing the light emission spectra of the light emitted from the light emitting device of Example 2 and the light after transmitting through the red filter thereof, and the transmission spectrum of the red filter.
Figure 8:
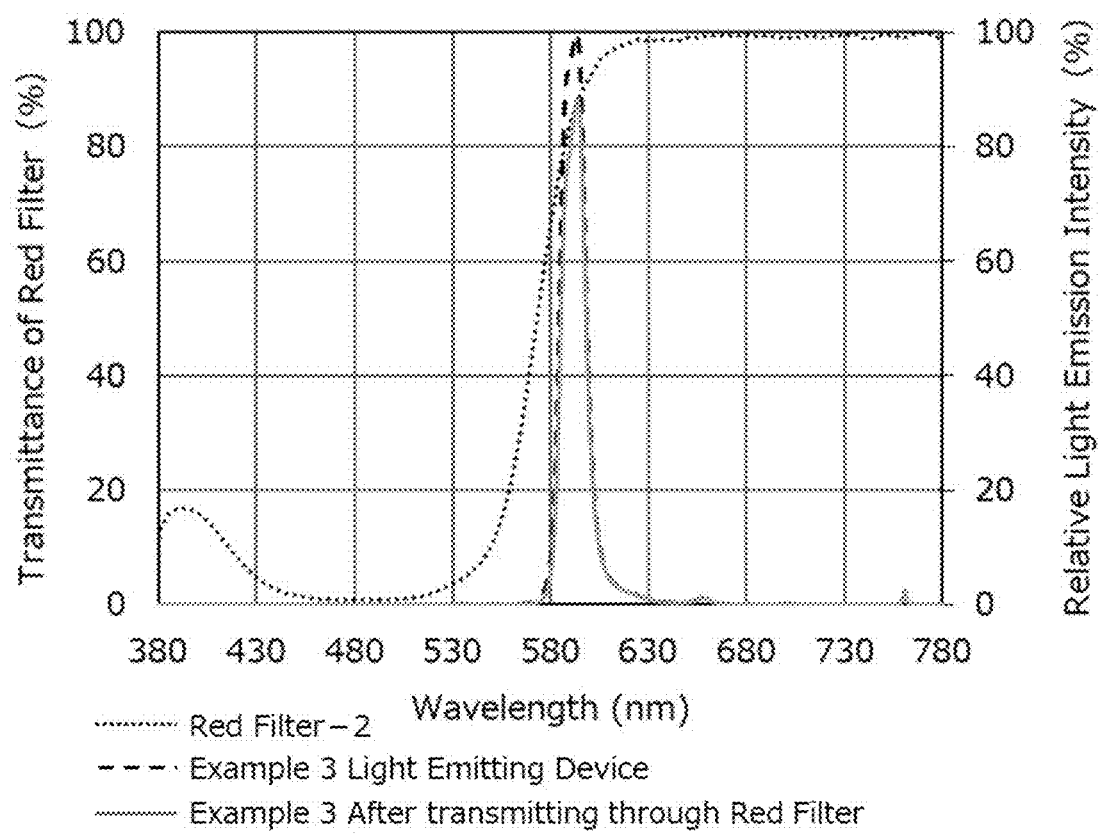
FIG. 8 is a chart showing the light emission spectra of the light emitted from the light emitting device of Example 3 and the light after transmitting through the red filter thereof, and the transmission spectrum of the red filter.
Figure 9:
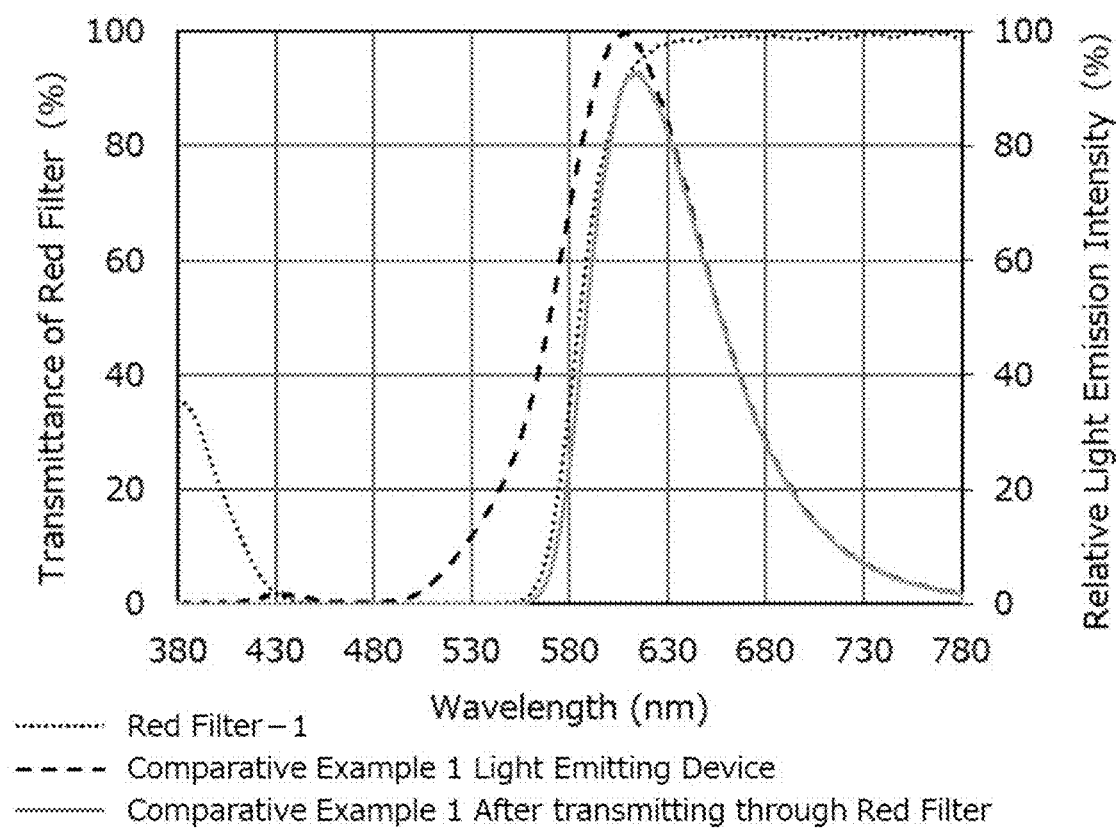
FIG. 9 is a chart showing the light emission spectra of the light emitted from the light emitting device of Comparative Example 1 and the light after transmitting through the red filter thereof, and the transmission spectrum of the red filter.
Figure 10:
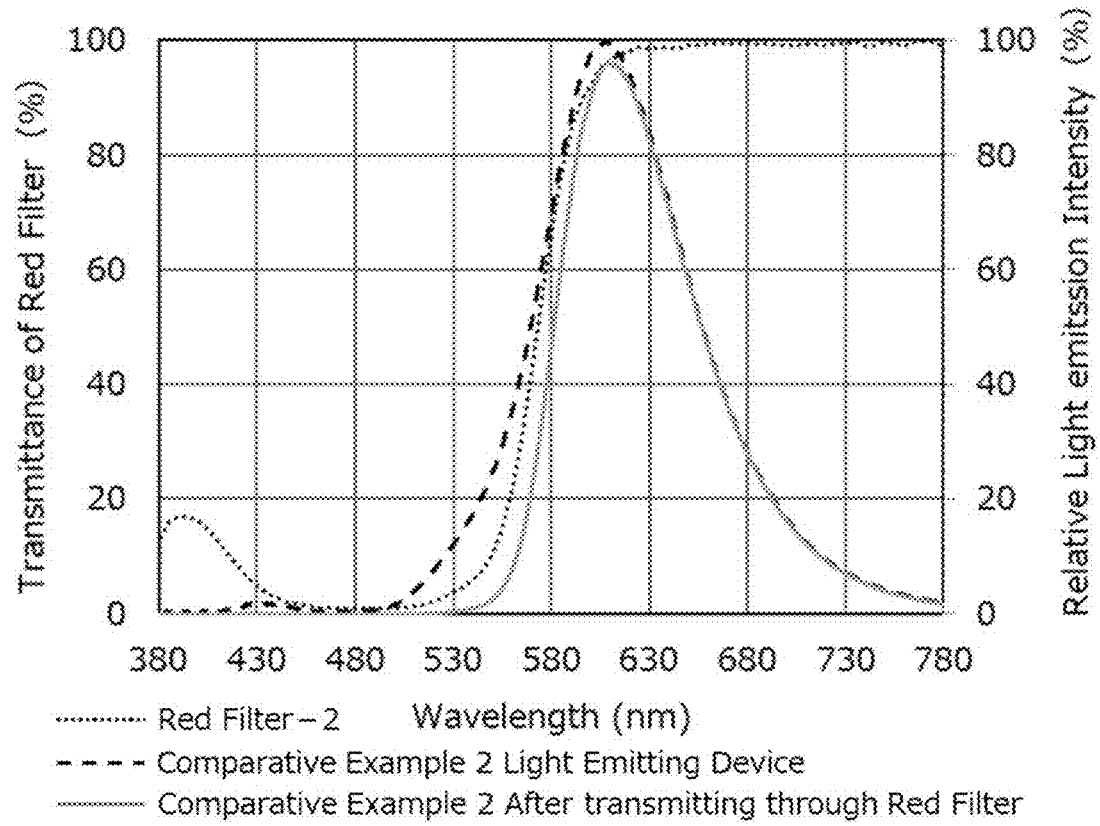
FIG. 10 is a chart showing the light emission spectra of the light emitted from the light emitting device of Comparative Example 2 and the light after transmitting through the red filter thereof, and the transmission spectrum of the red filter.
Figure 11:
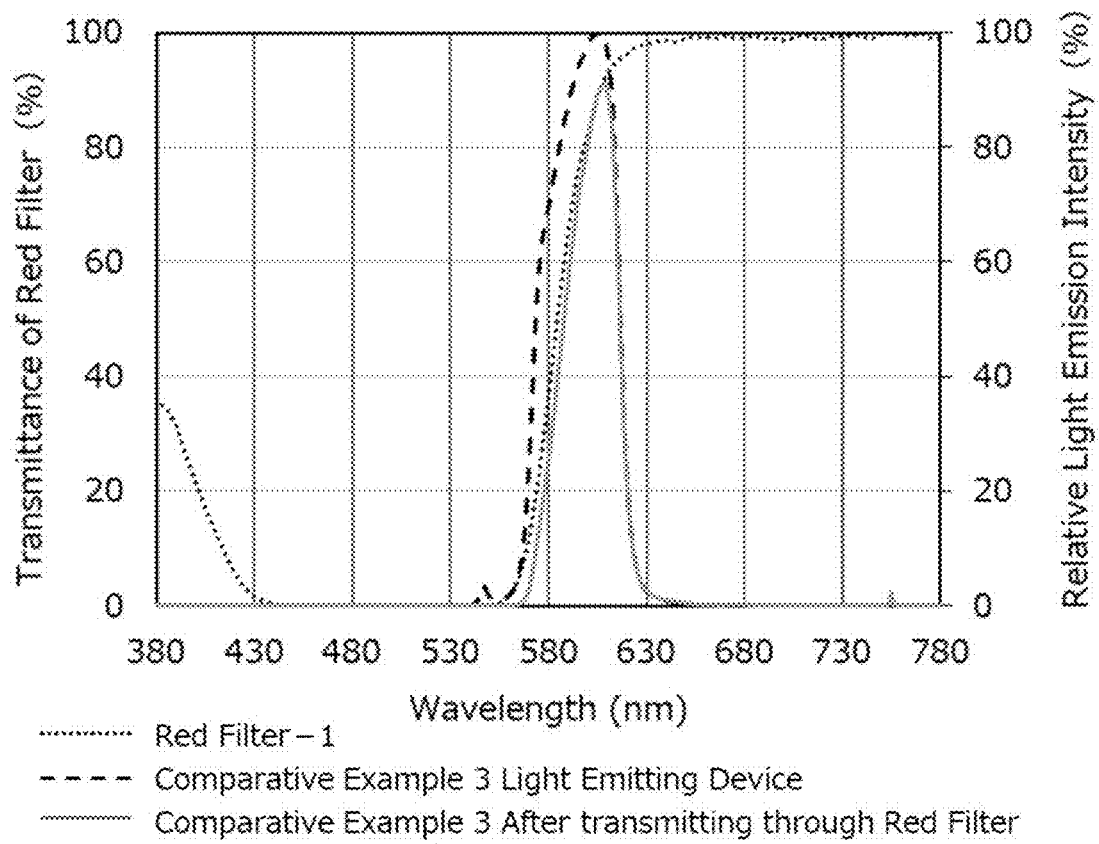
FIG. 11 is a chart showing the light emission spectra of the light emitted from the light emitting device of Comparative Example 3 and the light after transmitting through the red filter thereof, and the transmission spectrum of the red filter.

Light Emission Peak Wavelength, Full Width at Half Maximum, and Integrated Value Ratios $Z_2/Z_1$ and $Z_{R2}/Z_{R1}$ The light emitted from the light emitting devices of Examples and Comparative Examples and the light emitted from the light emitting devices and transmitted through the red filters each were measured for the light emission spectrum with a spectral photometer using an integral sphere (PMA-11, manufactured by Hamamatsu Photonics K.K.). The first light emission peak wavelength of the maximum light emission peak, the first full width at half maximum, and the first integrated value ratio $Z_2/Z_1$ of the integrated value $Z_2$ of the light emission intensity in a wavelength range of 400 nm or more and less than 600 nm with respect to the integrated value $Z_1$ of the light emission intensity in a wavelength range of 600 nm or more and 800 nm or less were obtained from each of the light emission spectra of the light emitted from the light emitting devices. The second light emission peak wavelength of the maximum light emission peak, the second full width at half maximum, and the second integrated value ratio $Z_{R2}/Z_{R1}$ of the integrated value $Z_{R2}$ of the light emission intensity in a wavelength range of 400 nm or more and less than 600 nm with respect to the integrated value $Z_{R1}$ of the light emission intensity in a wavelength range of 600 nm or more and 800 nm or less were obtained from each of the light emission spectra of the light emitted from the light emitting devices and transmitted through the red filters. FIG. 6 is a chart showing the light emission spectrum of the light emitted from the light emitting device of Example 1, the light emission spectrum of the light after transmitting through the red filter 2 thereof, and the transmission spectrum of the red filter 2. FIG. 7 is a chart showing the light emission spectrum of the light emitted from the light emitting device of Example 2, the light emission spectrum of the light after transmitting through the red filter 1 thereof, and the transmission spectrum of the red filter 1. FIG. 8 is a chart showing the light emission spectrum of the light emitted from the light emitting device of Example 3, the light emission spectrum of the light after transmitting through the red filter 2 thereof, and the transmission spectrum of the red filter 2. FIG. 9 is a chart showing the light emission spectrum of the light emitted from the light emitting device of Comparative Example 1, the light emission spectrum of the light after transmitting through the red filter 1 thereof, and the transmission spectrum of the red filter 1. FIG. 10 is a chart showing the light emission spectrum of the light emitted from the light emitting device of Comparative Example 2, the light emission spectrum of the light after transmitting through the red filter 2 thereof, and the transmission spectrum of the red filter 2. FIG. 11 is a chart showing the light emission spectrum of the light emitted from the light emitting device of Comparative Example 3, the light emission spectrum of the light after transmitting through the red filter 1 thereof, and the transmission spectrum of the red filter 1.

Wavelength Difference ΔW (Wt−Ws)

The wavelength Ws at a reflectance of 80% in the reflection spectrum of the dielectric multilayer film 1 (DBR-1) or the dielectric multilayer film 2 (DBR-2) and the wavelength Wt at a transmittance of 80% in the transmission spectrum of the red filter 1 or the red filter 2 were obtained, and the wavelength difference ΔW between the wavelength Wt and the wavelength Ws was obtained.

TABLE 5

| | Light emitting device | | | | | |
|---|---|---|---|---|---|---|
| | Color tone | | | First peak wavelength (nm) | First full width at half maximum (nm) | First integrated value ratio $Z_2/Z_1$ | Band-pass filter layer, short wavelength side Ws (nm) |
| | x | y | Region A | | | | |
| Example 1 | 0.591 | 0.408 | in | 605 | 44 | 1.4 | 570 |
| Example 2 | 0.587 | 0.412 | in | 594 | 15 | 6.7 | 584 |
| Example 3 | 0.587 | 0.412 | in | 594 | 15 | 6.7 | 584 |
| Comparative Example 1 | 0.572 | 0.418 | in | 609 | 87 | 0.6 | — |

TABLE 5-continued

| | | | | | | | |
|---|---|---|---|---|---|---|---|
| Comparative Example 2 | 0.572 | 0.418 | in | 609 | 87 | 0.6 | — |
| Comparative Example 3 | 0.591 | 0.408 | in | 605 | 44 | 1.4 | 570 |

| | Light emitting device + red filter | | | | | | |
|---|---|---|---|---|---|---|---|
| | Color tone | | | Second peak wavelength (nm) | Second full width at half maximum (nm) | Second integrated value ratio $Z_2/Z_1$ | Wavelength difference ΔW (Wt − Ws) (nm) |
| | x | y | Region A | | | | |
| Example 1 | 0.605 | 0.394 | in | 607 | 37 | 1.1 | 17 |
| Example 2 | 0.594 | 0.405 | in | 594 | 13 | 4.9 | 14 |
| Example 3 | 0.590 | 0.409 | in | 594 | 14 | 5.9 | 3 |
| Comparative Example 1 | 0.647 | 0.352 | out | 613 | 70 | 0.2 | — |
| Comparative Example 2 | 0.626 | 0.373 | out | 609 | 82 | 0.3 | — |
| Comparative Example 3 | 0.619 | 0.381 | out | 609 | 31 | 0.8 | 28 |

The light emitting devices of Examples 1 to 3 each emitted light that is amber in color within the target region A of the color tone range, and in the case in which the red filter was provided, had a chromaticity coordinate (x,y) within the region A and retained the light emission in amber color with less color tone change. The light emitting devices of Examples 1 to 3 each had a small wavelength difference ΔW of 25 nm or less between the wavelength Wt at a transmittance of 80% in the transmission spectrum of the red filter and the wavelength Ws at a reflectance of 80% on the short wavelength side in the reflection spectrum of the band-pass filter layer formed of the dielectric multilayer film, and had a small wavelength range that was cut by the red filter in the light that is amber in color transmitted through the band-pass filter layer, so as to suppress the color tone change after transmitting through the red filter, thereby maintaining the light emission in amber color.

The light emitting devices of Examples 1 to 3 each had the light emission spectrum having a first integrated value ratio $Z_2/Z_1$ in a range of 0.8 or more and 8.0 or less, and had the light emission spectrum after transmitting through the red filter having a second integrated value ratio $Z_{R2}/Z_{R1}$ of 0.5 or more.

As shown in FIGS. 6 to 8, the light emitting devices of Examples 1 to 3 each had the light emission spectrum of the light emitted from the light emitting device having a first full width at half maximum of the light emission peak in a range of 575 nm or more and 615 nm or less of 70 nm or less and the light emission spectrum of the light after transmitting through the red filter having a second full width at half maximum of the light emission peak in a range of 575 nm or more and 615 nm or less of 60 nm, and the light emitting devices each had narrow full widths at half maximum of the light emission peak in a range of 575 nm or more and 615 nm or less before and after transmitting through the red filter, had a chromaticity coordinate (x,y) in the target region A of the color tone range after transmitting through the red filter, and retained the light emission in amber color with less color tone change.

The light emitting devices of Comparative Examples 1 to 3 each had a chromaticity coordinate (x,y) in the target region A of the color tone range and emitted light that is amber in color, but the light after transmitting through the red filter had a chromaticity coordinate (x,y) deviated largely from the region A, and was visually recognized as red in color but not amber in color.

The light emitting devices of Comparative Examples 1 and 2 each had the light emission spectrum having a first integrated value ratio $Z_2/Z_1$ of less than 0.8, and had the light emission spectrum after transmitting through the red filter having a second integrated value ratio $Z_{R2}/Z_{R1}$ of less than 0.5. The light emitting devices of Comparative Examples 1 and 2 each had the small integrated value of the light emission intensity on the short wavelength side with respect to the integrated value of the light emission intensity on the long wavelength side, and the color tone was changed after transmitting through the red filter.

The light emitting device of Comparative Example 3 had the light emission spectrum having a first integrated value ratio $Z_{R2}/Z_{R1}$ of less than 0.9, and the light after transmitting through the red filter had the small integrated value of the light emission intensity on the short wavelength side with respect to the integrated value of the light emission intensity on the long wavelength side, and the light after transmitting through the red filter had a changed color tone and a chromaticity coordinate (x,y) deviated from the region A, and was visually recognized as red in color but not amber in color.

As shown in FIGS. 9 and 10, the light emitting devices of Comparative Examples 1 and 2 each had the light emission spectrum of the light emitted from the light emitting device having a broad first full width at half maximum of the light emission peak in a range of 575 nm or more and 615 nm or less beyond 70 nm and the light emission spectrum of the light after transmitting through the red filter having a broad second full width at half maximum of the light emission peak in a range of 575 nm or more and 615 nm or less of 70 nm or more, and the light after transmitting through the red filter failed to retain the light emission in amber color within the target region A of the color tone range, and was visually recognized as red in color.

As shown in FIG. 11, the light emitting device of Comparative Example 3 had the light emission spectrum of the light emitted from the light emitting device having a first full width at half maximum of the light emission peak in a range of 575 nm or more and 615 nm or less of 70 nm or less and the light emission spectrum of the light after transmitting through the red filter having a second full width at half maximum of the light emission peak in a range of 575 nm or more and 615 nm or less of 60 nm, and the light emitting devices each had narrow full widths at half maximum of the light emission peak in a range of 575 nm or more and 615 nm or less before and after transmitting through the red filter, and thus had a chromaticity coordinate (x,y) in the target region A of the color tone range before transmitting through the red filter. However, the light emitting device had a large wavelength difference ΔW of 28 nm between the wavelength Wt at a transmittance of 80% in the transmission spectrum of the red filter and the wavelength Ws at a reflectance of 80% on the short wavelength side in the reflection spectrum of the band-pass filter layer formed of the dielectric multilayer film, and had a large wavelength range that was cut by the red filter, changing the color tone largely, and therefore the light after transmitting through the red filter failed to retain the light emission in amber color within the target region A of the color tone range, and was visually recognized as red in color.

The light emitting device according to embodiments of the present disclosure can be applied to a light emitting device for a general illumination and a light emitting device for a vehicle.

The invention claimed is:

1. A light emitting device comprising:
   a light emitting element having a light emission peak wavelength in a range of 380 nm or more and 470 nm or less, and
   a wavelength conversion member disposed on a light emission side of the light emitting device and comprising:
      a fluorescent material layer containing a fluorescent material excited by light emitted from the light emitting device, having a light emission peak wavelength in a range of 500 nm or more and 780 nm or less, and
      a band-pass filter layer disposed on a light emission side of the fluorescent material layer, wherein:
   the band-pass filter layer is adapted to transmit light in a wavelength range of 560 nm or more and 630 nm or less, and
   for light having an incident angle in a range of 0° or more and 30° or less, the band-pass filter layer has an average reflectance of 90% or more to light in a wavelength range of 380 nm or more and less than 560 nm, and an average reflectance of 90% or more to light in a wavelength range of more than 630 nm and 780 nm or less,
   when measured while a red filter is disposed on a side of a light emission surface of the light emitting device, the band-pass filter layer has a wavelength difference ΔW of 25 nm or less between a wavelength Wt at a transmittance of 80% in a transmission spectrum of the red filter and a wavelength Ws at a reflectance of 80% on a short wavelength side in a reflection spectrum of the band-pass filter layer,
   the light emitting device is adapted to emit light that, in an xy chromaticity coordinate system of the CIE 1931 chromaticity diagram, is in a region A that is demarcated by a first straight line connecting a first point and a second point, a second straight line connecting a second point and a third point, a third straight line connecting a third point and a fourth point, and a fourth straight line connecting a fourth point and a first point, wherein chromaticity coordinates (x,y) are (x=0.545, y=0.425) for the first point, (x=0.557, y=0.442) for the second point, (x=0.609, y=0.390) for the third point, and (x=0.597, y=0.390) for the fourth point.

2. The light emitting device according to claim 1, wherein the light emitting device is adapted to emit light in the region A after transmitting through the red filter that has a wavelength at a transmittance of 80% in the transmission spectrum in a range of 615 nm or less.

3. The light emitting device according to claim 1, wherein the light emitting device has a light emission spectrum having a first integrated value ratio $Z_2/Z_1$ of an integrated value $Z_2$ of a light emission intensity in a wavelength range of 400 nm or more and less than 600 nm with respect to an integrated value $Z_1$ of a light emission intensity in a wavelength range of 600 nm or more and 800 nm or less of 0.8 or more.

4. The light emitting device according to claim 3, wherein the light emitting device has a light emission spectrum of light after transmitting through the red filter having a second integrated value ratio $Z_{R2}/Z_{R1}$ of an integrated value $Z_{R2}$ of a light emission intensity in a wavelength range of 400 nm or more and less than 600 nm with respect to an integrated value $Z_{R1}$ of a light emission intensity in a wavelength range of 600 nm or more and 800 nm or less of 0.5 or more.

5. The light emitting device according to claim 1, wherein the light emitting device has a light emission spectrum having a first light emission peak wavelength in a range of 575 nm or more and 615 nm or less and a first full width at half maximum of 70 nm or less.

6. The light emitting device according to claim 5, wherein the light emitting device has a light emission spectrum of light after transmitting through the red filter having a second light emission peak wavelength in a range of 575 nm or more and 615 nm or less and a second full width at half maximum of 60 nm or less.

7. The light emitting device according to claim 1, wherein the fluorescent material emitting light through excitation by light emitted from the light emitting element has a light emission spectrum having a light emission peak wavelength in a range of 520 nm or more and 670 nm or less and a full width at half maximum in a range of 2 nm or more and 120 nm or less.

8. The light emitting device according to claim 1, wherein the fluorescent material contains a rare earth aluminate fluorescent material having a composition containing Ce.

9. The light emitting device according to claim 1, wherein the fluorescent material contains an α-SiAlON fluorescent material.

10. The light emitting device according to claim 1, wherein the fluorescent material contains a nitride fluorescent material having a composition containing at least one kind of a first metal element $M^1$ selected from the group consisting of Ba, Sr, Ca, and Mg, at least one kind of a second metal element $M^2$ selected from the group consisting of Eu, Ce, Tb, and Mn, Si, and N, having a molar ratio of Si of 8, a molar ratio of N of 5, a molar ratio of the first metal element $M^1$ and the second metal element $M^2$ of 2, and a molar ratio of the second metal element $M^2$ of a product of a parameter y and 2, wherein the parameter y is a value in a range of 0.001 or more and 0.5 or less, per 1 mol of the composition.

11. The light emitting device according to claim 1, wherein the fluorescent material contains a nitride fluorescent material having a composition containing Ca, Si, Al, Eu, N, and depending on necessity Sr, having a molar ratio of Eu of 0.01 or more and 0.04 or less, a molar ratio of Si of 0.8 or more and 1.2 or less, and a molar ratio of N of 2.5 or more and 3.2 or less, per 1 mol of the composition.

12. The light emitting device according to claim 1, wherein the fluorescent material contains a fluoride fluorescent material having a composition containing at least one kind of an element A or an ion A selected from the group consisting of an alkali metal element and an ammonium ion, and at least one kind of an element $M^3$ selected from the group consisting of a Group 4 element and a Group 14 element, activated by $Mn^{4+}$.

13. The light emitting device according to claim 1, wherein the fluorescent material contains a rare earth aluminate fluorescent material having a composition represented by the following formula (I):

$$(Ln_{1-a}Ce_a)_3Al_5O_{12} \quad (I)$$

wherein in the formula (I), Ln represents at least one element selected from the group consisting of Y, Gd, Lu, and Tb, and a satisfies $0<a\leq0.022$.

14. The light emitting device according to claim 1, wherein the fluorescent material contains an α-SiAlON fluorescent material having a composition represented by the following formula (II):

$$Ca_b(Si,Al)_{12}(O,N)_{16}:Eu \quad (II)$$

wherein in the formula (II), b satisfies $0<b\leq2$.

15. The light emitting device according to claim 1, wherein the fluorescent material contains a nitride fluorescent material having a composition represented by the following formula (III):

$$(M^1_{1-c}M^2_c)_2Si_5N_8 \quad (III)$$

wherein in the formula (III), $M^1$ represents at least one element selected from the group consisting of Ba, Sr, Ca, and Mg, $M^2$ represents at least one element selected from the group consisting of Eu, Ce, Tb, and Mn, and c satisfies $0.001\leq c<0.5$.

16. The light emitting device according to claim 1, wherein the fluorescent material contains a nitride fluorescent material having a composition represented by the following formula (IV):

$$Ca_sSr_tEu_uSi_vAl_wN_x \quad (IV).$$

17. The light emitting device according to claim 1, wherein the fluorescent material contains a fluoride fluorescent material having a composition represented by the following formula (V):

$$A_2[M^3_{1-g}Mn^{4+}_gF_6] \quad (v)$$

wherein in the formula (V), A represents at least one kind of an element or an ion selected from the group consisting of K, Li, Na, Rb, Cs, and $NH_4^+$, $M^3$ represents at least one kind of an element selected from the group consisting of a Group 4 element and a Group 14 element, and g satisfies $0<g<0.2$.

18. The light emitting device according to claim 1, wherein, assuming that a maximum light emission intensity of the light emission peak wavelength in a light emission spectrum of the light emitting device is 1, the light emitting device has a light emission spectrum having a relative light emission intensity of 0.1 or less at a wavelength of 450 nm.

19. The light emitting device according to claim 1, wherein the band-pass filter layer comprises a dielectric multilayer film.

* * * * *